United States Patent
Bermel et al.

(10) Patent No.: US 9,516,760 B2
(45) Date of Patent: Dec. 6, 2016

(54) METHODS FOR PROVIDING ELECTRICALLY-CONDUCTIVE ARTICLES

(71) Applicants: Marcus Stephen Bermel, Pittsford, NY (US); Lisa Baxter Todd, Rochester, NY (US); Linda Mae Franklin, Rochester, NY (US); Thomas Henry Mourey, Rochester, NY (US); Christine Joanne Landry-Coltrain, Fairport, NY (US)

(72) Inventors: Marcus Stephen Bermel, Pittsford, NY (US); Lisa Baxter Todd, Rochester, NY (US); Linda Mae Franklin, Rochester, NY (US); Thomas Henry Mourey, Rochester, NY (US); Christine Joanne Landry-Coltrain, Fairport, NY (US)

(73) Assignee: EASTMAN KODAK COMPANY, Rochester, NY (US)

(*) Notice: Subject to any disclaimer, the term of this patent is extended or adjusted under 35 U.S.C. 154(b) by 0 days.

(21) Appl. No.: 14/602,384

(22) Filed: Jan. 22, 2015

(65) Prior Publication Data

US 2016/0219718 A1 Jul. 28, 2016

(51) Int. Cl.
| | | |
|---|---|---|
| *B05D 5/12* | (2006.01) | |
| *H05K 3/28* | (2006.01) | |
| *H01L 21/56* | (2006.01) | |
| *H01L 23/31* | (2006.01) | |

(52) U.S. Cl.
CPC ............ *H05K 3/28* (2013.01); *H01L 21/56* (2013.01); *B05D 5/12* (2013.01); *H01L 23/3157* (2013.01)

(58) Field of Classification Search
USPC ........................................ 427/98.4
See application file for complete search history.

(56) References Cited

U.S. PATENT DOCUMENTS

| | | | | | |
|---|---|---|---|---|---|
| 4,519,339 | A | * | 5/1985 | Izu ................ | C23C 16/517 118/718 |
| 6,623,797 | B2 | * | 9/2003 | Avalos ............ | B05C 5/0254 427/209 |
| 7,569,250 | B2 | * | 8/2009 | Nelson ............ | H05K 3/0091 427/211 |
| 2006/0240181 | A1 | * | 10/2006 | Li ................ | B81C 1/00539 427/96.2 |
| 2010/0025091 | A1 | * | 2/2010 | Ferdinandi ...... | H05K 3/282 174/257 |
| 2010/0253884 | A1 | * | 10/2010 | Katou ............ | G02B 5/3033 349/96 |
| 2012/0217045 | A1 | * | 8/2012 | Hukushima ...... | H05K 3/285 174/254 |
| 2014/0327452 | A1 | * | 11/2014 | Petcavich ........ | C12P 19/34 324/658 |

FOREIGN PATENT DOCUMENTS

| | | |
|---|---|---|
| WO | 2013/062630 A2 | 5/2013 |
| WO | 2013/063051 A1 | 5/2013 |

OTHER PUBLICATIONS

Juan Segurola et al., "Photoyellowing and discolouration of UV cured acrylated clear coatings systems: influence of photoinitiator type," *Polymer Degradation and Stability* 64 (1999) 39-48.

* cited by examiner

*Primary Examiner* — Brian K Talbot
(74) *Attorney, Agent, or Firm* — J. Lanny Tucker

(57) ABSTRACT

A method is used to provide an electrically-conductive article. This method includes: forming an electrically-conductive pattern on first supporting side of a transparent substrate that also comprises an opposing second supporting side; and forming a dry outermost polymeric coating over at least part but not all of the electrically-conductive pattern, the dry polymeric coating having a dry thickness of less than 5 μm, an integrated transmittance of at least 80%, and comprising a non-crosslinked thermoplastic polymer having a glass transition temperature ($T_g$) that is equal to or greater than 65° C.

14 Claims, No Drawings

METHODS FOR PROVIDING ELECTRICALLY-CONDUCTIVE ARTICLES

RELATED APPLICATIONS

Reference is made to the following copending and commonly assigned patent applications, all filed on even date herewith:

U.S. Ser. No. 14/602,372 filed by Bermel, Todd, Franklin, Mourey, and Landry-Coltrain and entitled "Electrically-conductive Articles with Protective Polymeric Coatings";

U.S. Ser. No. 14/602,500 filed by Bermel, Todd, Franklin, Mourey, and Landry-Coltrain and entitled "Patterning Continuous Webs with Protected Electrically-conductive Grids"; and U.S. Ser. No. 14/602,509 filed by Bermel, Franklin, Todd, Mourey, and Landry-Coltrain and entitled "Devices with Protected Electrically-conductive Metal Grids".

FIELD OF THE INVENTION

This invention relates to methods for making electrically-conductive articles comprising one or more electrically-conductive patterns that generally include one or more electrically-conductive metal patterns. A dry polymeric coating is generally disposed over at least part of the electrically-conductive patterns for various protective and coloration features.

BACKGROUND OF THE INVENTION

Rapid advances are occurring in various electronic devices especially display devices that are used for various communicational, financial, and archival purposes. For such uses as touch screen panels, electrochromic devices, light-emitting diodes, field-effect transistors, and liquid-crystal displays, electrically-conductive films are essential and considerable efforts are being made in the industry to improve the properties of those electrically-conductive films and particularly to improve metal grid or line conductivity and to provide as much correspondence between mask design with resulting user metal patterns.

Electrically-conductive articles used in various electronic devices including touch screens in electronic, optical, sensory, and diagnostic devices including but not limited to telephones, computing devices, and other display devices have been designed to respond to touch by a human fingertip or mechanical stylus. Typically, touch screen technology incorporates the use of resistive or capacitive sensor layers that make up part of the display.

Typically, touch screen technology incorporates the use of resistive or capacitive sensor layers that make up part of the display. There is a need to provide touch screen sensors and displays that contain improved electrically-conductive film elements. Currently, such resistive and capacitive touch screen displays use Indium Tin Oxide (ITO) coatings to create arrays used to distinguish multiple points of contacts. Efforts are underway in the industry to find useful replacements for ITO coatings including the use of various other electrically-conductive metallic compositions. ITO is in limited supply and exhibits undesirable fragility, lack of flexibility, and low conductivity compared to other materials.

As noted, touch screens are often prone to damage due to the increased level of direct contact (touching) by the user of the display or from moisture or water in the environment. Both resistive and capacitive touch sensors can include translucent (or nearly transparent) electrically insulating covering materials disposed on the display structure in order to protect and isolate the touch screen sensors from environmental conditions (such as moisture), abrasion, oxygen, and any harmful chemical agents.

There is also a need to protect the electrically-conductive portions of the sensor from environmental damage (such as from moisture) and both environmental and physical damage during manufacturing and integration operations.

Such electrically insulating covering materials include glass or polyester layers as protective covers. Each of these materials has advantages and disadvantages. WO 2013/062630 (Petcavich) and WO 2013/063051 (Petcavich et al.) both describe the formation of crosslinked polymeric protective layers over touch sensors (and display screens) using photocurable compositions containing various photoinitiators and photocuring materials.

U.S. Pat. No. 7,569,250 (Nelson) describes a process for applying a protective coating to a flex circuit having conductive traces on one surface and by applying a protective coating in substantially a liquid state to the one surface from a roller including a protective coating in a patternwise fashion. Portions of the flex circuit are left exposed (uncoated) for connection to an electronic device such as a print head assembly. A protective coating can be applied to a surface of the flex circuit and then further treated for example by crosslinking or thermal curing.

While such materials can provide protective surfaces in touch sensors, it would be desirable to avoid crosslinkable materials because of the additional processing procedure that is needed as well as the potential problems associated with photoinitiators or other crosslinking agents that may remain chemically reactive in the final protective surface and that can cause yellowing if left as residue in the protective coatings.

In addition, residual photoinitiators used in photocuring operations used to prepare protective coatings can pose adhesion and shrinkage problems, at least partially due to their low molecular weight, high mobility, and likely high initial concentrations so that residual concentrations after photocuring can be as much as 15% of the final protective covering weight. These problems can be particularly apparent in photocurable compositions that are applied to electrically-conductive patterns using printing methods such as flexography at high curing and printing speeds.

Thus, there is a need for improved protection of electrically-conductive patterns especially when high concentrations of photocuring photoinitiators are present so that yellowing and other problems are minimized.

SUMMARY OF THE INVENTION

The present invention provides a method for providing an electrically-conductive article, the method comprising:

forming an electrically-conductive pattern on first supporting side of a transparent substrate that also comprises an opposing second supporting side; and forming a dry outermost polymeric coating over at least part but not all of the electrically-conductive pattern, the dry polymeric coating having a dry thickness of less than 5 μm, an integrated transmittance of at least 80%, and comprising a non-crosslinked thermoplastic polymer having a glass transition temperature ($T_g$) that is equal to or greater than 65° C.

In some embodiments, the method can further comprise:

forming an electrically-conductive pattern on the opposing second supporting side of the transparent substrate, and forming a dry outermost polymeric coating over at least part but not all of the electrically-conductive pattern on the opposing second supporting side of the transparent substrate, this dry polymeric coating having a dry thickness of less than 5 μm, an integrated transmittance of at least 80%, and comprising a non-crosslinked thermoplastic polymer having a glass transition temperature ($T_g$) that is equal to or greater than 65° C.

In other embodiments, the method comprises:

forming multiple electrically-conductive patterns on respective multiple portions on the first supporting side of the continuous transparent polymeric web, and forming a dry outermost polymeric coating on at least part but not all of each of the electrically-conductive patterns in the multiple portions, the dry outermost polymeric coating disposed on each of the multiple electrically-conductive patterns having a dry thickness of less than 5 μm, an integrated transmittance of at least 80%, and comprising a non-crosslinked, non-aromatic thermoplastic polymer having a glass transition temperature ($T_g$) that is equal to or greater than 65° C.

The present invention provides a number of advantages. Because the dry outermost polymeric coating is not crosslinked (or crosslinkable), the dry outermost polymeric coating requires no curing or post-processing, thereby reducing the complexity of the printing apparatus and process. In addition, the problems associated with photoinitiators and other crosslinking agents, such as yellowing from residual reactants and other problems associated with post-curing chemical reactions are avoided. In addition, potential problems from shrinkage and adhesion are also avoided since low molecular weight materials (such as photoinitiators) are not required. Finally, the dry outermost polymeric layer is highly transparent and can be properly used to cover all or only part of the electrically-conductive patterns so that appropriate electrical connections can be achieved when desired.

DETAILED DESCRIPTION OF THE INVENTION

The following discussion is directed to various embodiments of the present invention and while some embodiments can be desirable for specific uses, the disclosed embodiments should not be interpreted or otherwise considered to limit the scope of the present invention, as claimed below. In addition, one skilled in the art will understand that the following disclosure has broader application than is explicitly described with specific embodiments.

DEFINITIONS

As used herein to define various components of the electrically-conductive patterns and dry outermost polymeric coatings, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard printed dictionary.

The use of numerical values in the various ranges specified herein, unless otherwise expressly indicated, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

As used herein, the term "photocuring" means the polymerization of functional oligomers and monomers, or even polymers, into a crosslinked polymer network, in response to irradiation of such materials, for example irradiation using ultraviolet (UV), visible, or infrared radiation at a suitable wavelength.

The term "photocurable" is used to define a material (or component) that will polymerize or crosslink when irradiated with suitable radiation, for example irradiated with radiation such as ultraviolet (UV), visible, or infrared radiation in an appropriate environment.

The term "polymerization" is used herein to mean the combining, for example by covalent bonding, of a large number of smaller molecules, such as monomers, to form very large molecules, that is, macromolecules or polymers. The monomers can be combined to form only linear macromolecules or they can be combined to form three-dimensional macromolecules that are commonly referred to as crosslinked polymers. One type of polymerization that can be carried out in the practice of this invention is acid-catalyzed (cationic) polymerization utilizing the photo-generation of acidic radicals. Another type of polymerization is free radical polymerization utilizing photo-generation of free radicals when free radically polymerizable materials and suitable free radical generating photoinitiators are present. In some useful embodiments of the present invention, both acid-catalyzed polymerization and free radically polymerization can be used simultaneously in carrying out the present invention.

A "thermoplastic polymer" refers to a polymer that has no crosslink sites between individual polymer macromolecules and becomes liquid, pliable, or moldable above a specific temperature, and then it returns to a solid state upon cooling. In many instances, the thermoplastic polymers are also soluble in appropriate organic solvent media.

Recurring units in the non-crosslinked thermoplastic polymers described herein are generally derived from the polymerizable units used in a condensation or free radical polymerization process, which polymerizable units have the desired properties and contribute to the desired polymer $T_g$.

Unless otherwise indicated, the term "mol %" when used in reference to recurring units in polymers, refers to either the nominal (theoretical) amount of a recurring unit based on the molecular weight of ethylenically unsaturated polymerizable monomer used in the polymerization process, or to the actual amount of recurring unit in the resulting polymer as determined using suitable analytical techniques and equipment.

Average dry thickness of layers (such as the dry outermost polymeric coating) described herein can be determined from the average of at least two separate measurements taken of a dry layer, for example, using electron microscopy, optical microscopy, or profilometry.

Similarly, the average dry thickness or width of lines, grid lines, or other pattern features described herein can be the average of at least two separate measurements taken, for example, using electron microscopy, optical microscopy, or profilometry.

"Actinic radiation" is used to refer to any electromagnetic radiation that is capable of producing photocuring or photopolymerizing action in accordance with the present invention and that has a wavelength of at least 200 nm and up to and including 1400 nm, and typically at least 200 nm and up to and including 750 nm, or even at least 300 nm and up to and including 700 nm. The term "exposing radiation" also refers to such actinic radiation.

The term "UV radiation" is used herein to refer to electromagnetic radiation having a wavelength ($\lambda_{max}$) of at least 200 nm and up to and including 400 μm.

Weight-average molecular weight ($M_w$) is determined using Size Exclusion Chromatography (SEC). Values reported herein are reported as poly(methyl methacrylate) equivalent weights.

Glass transition temperature ($T_g$) can be determined using Differential Scanning calorimetry (DSC) and values reported herein refer to indium standards.

The terms "transparent" and "transparency" used herein in reference to substrates, polymeric layers including the dry outermost polymeric coatings, refer to materials and structures having an integrated transmittance of at least 80% and more likely at least 90%. Integrated transmittance is measured over the visible region of the electromagnetic spectrum (for example from 410 nm to 700 nm) using a spectrophotometer and known techniques.

As used herein, the terms "electrically-conductive pattern" refers to a pattern of electrically-conductive material, in a predetermined or randomly arranged pattern that will have the function of carrying electrical current. In most embodiments, such electrically-conductive patterns are electrically-conductive metal patterns although other electrically-conductive materials can be used, such as electrically-conductive polymers, carbon nanotubes, graphene, and other electrically-conductive carbon structures, can be used in other embodiments. The electrically-conductive patterns can be composed of multiple regions, some of which are designed to be within a "touch" region of an electronic device (such as a touch screen sensor) into which the electrically-conductive article is incorporated. Other regions of the electrically-conductive pattern can be outside the "touch" region and arranged within border or electrically-connective regions. Such regions can consist of electrically-conductive bus lines, probe pads, electrodes, and connectors. The connectors or connector pads as defined for the present invention are the electrically-conductive regions of the electrically-conductive pattern that will be connected to the external power connections, detectors, circuits, or other external components. For example, each electrically-conductive pattern can comprise an "electrically-conductive grid" or "electrically-conductive metal grid" that can be disposed in the "touch" region. The electrically-conductive pattern can also comprise an "electrically-conductive connector" or "electrically-conductive metal connector" outside the "touch" region and be part of a connector pad. Still other regions can comprise other electrically-conductive lines and interconnections that provide pathways for electrical current within the device component.

Uses

The articles and methods of the present invention can be used in a variety of technologies and electronic devices including but not limited to touch screen sensors, displays, integrated circuit components, microchips, thin film transistor components, and other display or functional devices that can be used in numerous consumer, industrial, and commercial products.

Touch screen technology can comprise different touch sensor configurations including capacitive and resistive touch sensors. Resistive touch sensors comprise several layers that face each other with a gap between adjacent layers that may be preserved by spacers formed during manufacturing. A resistive touch screen panel can comprise several layers including two thin electrically-conductive layers (usually metallic in composition) separated by a gap that can be created by spacers. When an object such as a stylus, palm, or fingertip presses down on a point on the panel's outer surface, the two thin electrically-conductive layers come into contact and a connection is formed that causes a change in the electrical current. This change in electrical current from the touch event is sent to a controller for further processing.

Capacitive touch sensors can be used in electronic devices with touch-sensitive features. These electronic devices can include but are not limited to, televisions, monitors, automated teller machines, and projectors that can be adapted to display images including text, graphics, video images, movies, still images, and presentations. The image devices that can be used for these display devices that can include cathode ray tubes (CRS's), projectors, flat panel liquid crystal displays (LCD's), LED systems, OLED systems, plasma systems, electroluminescent displays (ECD's), and field emission displays (FED's). For example, the present invention can be used to prepare capacitive touch sensors that can be incorporated into electronic devices with touch-sensitive features to provide computing devices, computer displays, portable media players including e-readers, mobile telephones and other portable communicating devices.

Systems and methods of fabricating flexible and optically compliant touch sensors in a high-volume roll-to-roll manufacturing process where micro electrically-conductive features can be created in a single pass are possible using the present invention. Multiple printing members such as multiple flexographic printing plates can be used to form multiple high resolution electrically-conductive patterns (or images) from predetermined designs or patterns provided in those multiple printing members. Multiple patterns can be printed on one or both sides of a transparent substrate as described in more details below. For example, one predetermined pattern can be formed on one side of the transparent substrate and a different predetermined pattern can be formed on the opposing side of the transparent substrate. The dry outermost polymeric coating described herein can be incorporated or disposed over at least part but not all of each of the multiple electrically-conductive patterns.

Outermost Polymeric Coatings

The outermost polymeric coatings used in the present invention are derived from mixing one or more non-crosslinked thermoplastic polymers (hereinafter "polymers" if not otherwise indicated), each or the mixture of polymers having a glass transition temperature ($T_g$) that is equal to or greater than 65° C.

Useful non-crosslinked thermoplastic polymers can be used to provide transparent films as defined herein having an integrated transmittance as described above.

Such non-crosslinked thermoplastic polymers can be condensation polymers including but not limited to, polyesters, polyamides, polyimides, polycarbonates, polyurethanes, polyureas, and polysulfones. More likely, the non-crosslinked thermoplastic polymers are addition polymers derived from one or more ethylenically unsaturated polymerizable monomers, such polymers include but are not limited to, polyvinyl acetals, polyacrylics, polyacrylamides, polystyrenes, polyolefins, polyvinyl halides, polyvinylidene halides, polysulfones, and polyvinyl ethers. Naturally-occurring or synthetic cellulosics can also be used.

Useful non-crosslinked thermoplastic polymers can be linear, branched, comb. or any other known polymer topology. Also useful are block, graft, or tapered copolymers or polymers containing multiple monomers of various topologies as long at the other properties described herein are achieved.

Particularly useful non-crosslinked thermoplastic polymers are "non-aromatic" meaning that no carbocyclic aromatic or heterocyclic aromatic moieties (or groups) are purposely incorporated within the polymer.

Useful non-crosslinked thermoplastic polymers of this type include acrylic polymers that are derived from at least one or more acrylate or methacrylate ethylenically unsaturated polymerizable monomers. Such monomers are used to provide at least 5 mol % or at least 10 mol % and up to and including 100 mol %, of the "acrylic" recurring units in the (co)polymer based on the total recurring units. If the "acrylic" recurring units comprise less than 100 mol %, the remaining recurring units can be derived from one or more ethylenically unsaturated polymerizable monomers that would be apparent to a skilled worker in the art, as long as such recurring units do not comprise carbocyclic aromatic or heterocyclic aromatic moieties or other functional groups that are capable of undergoing discoloration reactions. Thus, the useful acrylic polymers can be homopolymers or copolymers that comprise two or more different recurring units derived from two or more different ethylenically unsaturated polymerizable monomers.

Thus, the acrylate or methacrylate ethylenically unsaturated polymerizable monomers can comprise suitable ester alkyl groups that can be unsubstituted or substituted with one or more alkoxy, hydroxyalkoxy, alkoxyalkoxy, or haloalkoxy groups. For example, such useful ethylenically unsaturated polymerizable monomers include hydroxyalkyl methacrylates (such as hydroxymethyl methacrylate), methyl methacrylate, ethyl methacrylate, methyl acrylate, ethyl acrylate, n-butyl acrylate, n-butyl methacrylate, iso-butyl methacrylate, t-butyl acrylate, t-butyl methacrylate, n-hexyl methacrylate, n-dodecyl acrylate, 2-ethylhexyl methacrylate, 2-ethylhexyl acrylate, cyclohexyl methacrylate, cyclohexyl acrylate, glycidyl methacrylate, glycidyl acrylate, chloromethyl acrylate, or a hydroxyalkyl acrylate such as hydroxyethyl acrylate or hydroxypropyl acrylate.

In many embodiments, the non-crosslinked thermoplastic polymers are copolymers (including terpolymers), each comprising recurring units derived from methyl(meth)acrylate (meaning either methyl acrylate or methyl methacrylate) and recurring units derived from an alkyl(meth)acrylate wherein the alkyl has at least 1 carbon atom and up to and including 18 carbon atoms, wherein the recurring units derived from the alkyl(meth)acrylate comprise at least 5 mol % and up to and including 25 mol % of the total copolymer recurring units, and recurring units derived from methyl methacrylate would comprise the rest of the copolymers. Useful ethylenically unsaturated polymerizable monomers are described above and others would be readily apparent to one skilled in the art.

Other useful ethylenically unsaturated polymerizable monomers that can be used to provide recurring units in the copolymers include but are not limited to acrylamide, methacrylamide, acrylic acid, methacrylic acid, acrylonitrile, vinyl acetate, vinyl chloride, and vinylidene chloride, or any other ethylenically unsaturated non-aromatic polymerizable monomer that is capable of copolymerizing with (meth)acrylates.

The non-crosslinked thermoplastic polymers can be prepared to have one or more different types of recurring units derived from one or more ethylenically unsaturated polymerizable monomers described above, and such recurring units can be arranged within the polymer in any desired order, for example, randomly, alternately, in blocks, or other arrangements that would apparent to one skilled in the polymeric chemistry art.

The mol % amounts of the various recurring units defined herein for the described polymers are meant to refer to the actual molar amounts present in the polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all ethylenically unsaturated polymerizable monomers, the actual mol % of each ethylenically unsaturated polymerizable monomer is generally within ±15 mol % of the theoretical amounts.

Some representative non-crosslinked thermoplastic polymers include but are not limited to, the following polymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of ethylenically unsaturated polymerizable monomers if the polymerization reactions are not carried out to completion.

Poly(methyl methacrylate-co-n-butyl methacrylate) 90:10 mole ratio;

Poly(methyl methacrylate-co-n-butyl methacrylate) 75:25 mole ratio;

Poly(methyl methacrylate-co-n-butyl methacrylate-co-methacrylic acid) 85:15:5 mole ratio;

Poly(methyl methacrylate-co-hexyl methacrylate) 90:10 mole ratio;

Poly(methyl methacrylate-co-octyl methacrylate) 90:10 mole ratio;

Poly(methyl methacrylate-co-lauryl methacrylate) 90:10 mole ratio;

Poly(ethyl methacrylate-co-n-butyl methacrylate-co-methacrylic acid) 80:15:5 mole ratio; and Poly(ethyl methacrylate-co-methacrylic acid) 90:10 mole ratio.

Many useful non-crosslinked thermoplastic copolymers and terpolymers are commercially available. For example, poly(methyl methacrylate-co-n-butyl methacrylate) is available as ELVACITE® 4028; poly(methyl methacrylate-co-n-butyl methacrylate-co-methacrylic acid) is available as ELVACITE® 2614; and poly(methyl methacrylate-co-lauryl methacrylate) is available as ELVACITE® 2552 from Lucite International. Other various non-crosslinked thermoplastic polymers can be either purchased from various commercial sources, or they can be prepared using known polymerization techniques and known starting materials and organic solvents. Where starting materials (such as ethylenically unsaturated polymerizable monomers) are not available commercially, such starting materials can be synthesized using known chemical starting materials and procedures.

Preparation of Articles with Dry Outermost Polymer Coatings

In general, articles of the present invention are prepared by firstly providing a suitable transparent substrate having a first supporting side and an opposing second supporting side (the opposing planar sides as opposed to edges). Suitable transparent substrates can be composed of various materials.

Suitable transparent substrates include but are not limited to, glass (including flexible glasses), glass-reinforced epoxy laminates, cellulose triacetate, acrylic esters, polycarbonates, adhesive-coated polymer transparent substrates, polyester films, and transparent composite materials. Suitable transparent polymers for use as transparent polymer substrates include but are not limited to, polyethylene and other polyolefins, polyesters such as polyethylene terephthalate (PET), polyethylene naphthalate (PEN), poly-1,4-cyclohexanedimethylene terephthalate, poly(butylene terephthalate), and copolymers thereof, polypropylenes, polyvinyl acetates, polyurethanes, polyamides, polyimides, polysulfones, polycarbonates, poly(methyl methacrylate), and other materials that would be readily apparent to one skilled in the art. Other useful transparent substrates can be composed of cellulose derivatives such as a cellulose ester, cellulose triacetate, cellulose diacetate, cellulose acetate propionate, cellulose acetate butyrate, polyacrylates, polyether imides, and mixtures thereof.

Transparent polymeric substrates can also comprise two or more layers of the same or different polymeric composition to form a composite transparent laminate substrate. The transparent substrate can be treated on either or both supporting sides to improve adhesion of any disposed layers or electrically-conductive patterns. For example, the transparent substrate can be coated with a polymer adhesive layer, can be chemically treated, or subjected to a corona treatment, on one or both supporting sides.

Biaxially-oriented sheets, while appearing to have one layer, can also be provided with additional layers that can serve to change the optical or other properties of the biaxially-oriented sheet. Such layers might contain tinting agents, antistatic or conductive materials, or slip agents as long as desired integrated transmittance is preserved.

The use of flexible transparent substrates for the manufacture of flexible electronic devices or touch screen components facilitates rapid roll-to-roll manufacture. ESTAR® poly(ethylene terephthalate) films, MELLINEX® poly(ethylene terephthalate) films, and cellulose triacetate films are particularly useful materials for making flexible transparent substrates including continuous substrate webs.

The transparent substrate can have a thickness of at least 20 μm and up to and including 300 μm or typically at least 75 μm and up to and including 200 μm. Antioxidants, antistatic or conductive agents, plasticizers, and other useful additives can be incorporated into the transparent substrate, if desired, in amounts that would be readily apparent to one skilled in the art as long as desired integrated transmittance is achieved.

Electrically-conductive patterns (such as electrically-conductive metal patterns) that can include electrically-conductive grids (such as electrically-conductive metal grids) and electrically-conductive connectors (such as electrically-conductive metal connectors) can be disposed on either or both of the first supporting side and the opposing second supporting side of the transparent substrate using any desirable means, of which there are several technologies known in the art.

Some electrically-conductive patterns can be composed from one or more electrically-conductive polymers, many of which are known in the art. For example, such electrically-conductive polymers can be selected from substituted or unsubstituted pyrrole-containing polymers [as described for example in U.S. Pat. No. 5,665,498 (Savage et al.) and U.S. Pat. No. 5,674,654 (Zumbalyadis et al.)]; substituted or unsubstituted thiophene-containing polymers [as described for example, in U.S. Pat. No. 5,300,575 (Joans et al.), U.S. Pat. No. 5,312,681 (Muys et al.), U.S. Pat. No. 5,354,613 (Quinters et al.), U.S. Pat. No. 5,370,981 (Krafft et al.), U.S. Pat. No. 5,372,924 (Quinters et al.), U.S. Pat. No. 5,391,472 (Muys et al.), U.S. Pat. No. 5,403,467 (Jonas et al.), U.S. Pat. No. 5,443,944 (Azoulay), U.S. Pat. No. 4,987,042 (Jonas et al.), and U.S. Pat. No. 4,731,408 (Jasne)]; and substituted or unsubstituted aniline-containing polymers [as described for example in U.S. Pat. No. 5,716,550 (Gardner et al.), U.S. Pat. No. 5,093,439 (Epstein et al.), and U.S. Pat. No. 4,070,189 (Kelley et al.)]. Particularly useful electrically-conductive polymers are those present in their cationic form and comprise a polyanion, including thiophene-containing polymers used in combination with a suitable polyanion that can be a polyacid such as a polycarboxylic acid or a polysulfonic acid that is a homopolymer or copolymer. The disclosures of all of these cited patents are incorporated herein by reference with respect to the electrically-conductive polymers that can be used in the practice of the present invention.

Some electrically-conductive patterns can be composed of one or more electrically-conductive carbon structures, many of which are known in the art, including for example, conductive carbon black, carbon nanotubes, graphite, graphene, or combinations thereof.

In other embodiments, the electrically-conductive patterns are designed to have metallic characteristics. For example, photosensitive silver halide technology can be used for this purpose to provide electrically-conductive silver patterns on one or both supporting sides of a transparent substrate, for example as described in U.S. Patent Application Publications 2011/0289771 (Kuriki) and 2011/0308846 (Ichiki). Additional silver halide technology used for this purpose is also described in copending and commonly assigned U.S. Ser. No. 14/468,626 (filed Aug. 26, 2014 by Lushington), the disclosure of which is incorporated herein by reference. In such technology, silver halide emulsions can be designed on one or both supporting sides of transparent substrates, exposed through suitable masks, and the patterns formed by this exposure can then be processed to form silver metal patterns and the non-exposed silver halide emulsion is suitably removed. The various electrically-conductive silver patterns can be designed to have desired patterns using predetermined mask elements with corresponding patterns.

In still other embodiments, the electrically-conductive patterns such as electrically-conductive metal patterns can be formed on one or both supporting sides of the transparent substrates using photocurable compositions that can provide seed metal catalysts for electroless plating processes. For example, the photocurable compositions can comprise acid-catalyzed photocurable chemistry, free radical photocurable chemistry, or both types of chemistry, examples of which are described below, but the present invention is not limited to the described photocurable chemistries and can be carried out using any known photocurable compositions that can further comprise seed metal catalysts that are suitable for electroless metal plating processes.

Acid-Catalyzed Photocurable Chemistries:

In some embodiments, useful photocurable compositions comprise one or more UV-curable components at least one of which is an acid-catalyzed photocurable component. Such photocurable compositions can further comprise a photoacid generator that participates in the generation of acid radicals that cause photocuring of photocurable components.

Some useful acid-catalyzed photocurable components are photocurable epoxy materials. Cationically photocurable epoxy materials can be organic compounds having at least one oxirane ring, which oxirane ring is shown in the following formula:

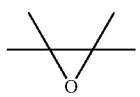

that is polymerizable (photocurable) by a ring opening mechanism. Such epoxy materials include monomeric epoxy compounds and epoxides of the polymeric type and can be aliphatic, cycloaliphatic, aromatic or heterocyclic. These materials generally have, on the average, at least one polymerizable epoxy group per molecule, or typically at least about 1.5 or even at least about 2 polymerizable epoxy groups per molecule. Polymeric epoxy materials include linear polymers having terminal epoxy groups (for example, a diglycidyl ether of a polyoxyalkylene glycol), polymers having skeletal (backbone) oxirane units (for example, polybutadiene polyepoxide), and polymers having pendant epoxy groups (for example, a glycidyl methacrylate polymer or copolymer). The photocurable epoxy materials can be single compounds or they can be mixtures of different epoxy materials containing one, two, or more epoxy groups per molecule.

The epoxy materials can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature. Illustrative of permissible substituent groups include but are not limited to, halogens, ester groups, ethers, sulfonate groups, siloxane groups, nitro groups, and phosphate groups.

Useful epoxy materials include those that contain cyclohexene oxide groups such as epoxycyclohexane carboxylates, such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxy materials of this nature is provided in U.S. Pat. No. 3,117,099 (Proops et al.).

Still other useful epoxy materials include glycidyl ether monomers that are glycidyl ethers of polyhydric phenols obtained by reacting a polyhydric phenol with an excess of a chlorohydrin such as epichlorohydrin [for example, the diglycidyl ether of 2,2-bis-(2,3-epoxypropoxyphenol)-propane]. Further examples of epoxy materials of this type are described in U.S. Pat. No. 3,018,262 (Schroeder) and in "Handbook of Epoxy Resins" by Lee and Neville, McGraw-Hill Book Co., New York (1967).

Still other useful epoxy materials are resins such as copolymers derived from acrylic acid esters reacted with glycidol such as glycidyl acrylate and glycidyl methacrylate, copolymerized with one or more ethylenically unsaturated polymerizable monomers. Other useful epoxy materials are epichlorohydrins, alkylene oxides such as propylene oxide and styrene oxide, alkenyl oxides such as butadiene oxide, and glycidyl esters such as ethyl glycidate. Still other useful epoxy materials are silicones having an epoxy functionality or group such as cyclohexylepoxy groups, especially those epoxy materials having a silicone backbone. Commercial examples of such epoxy materials include UV 9300, UV 9315, UV 9400, UV 9425 silicone materials that are available from Momentive.

Polymeric epoxy materials can optionally contain other functionalities that do not substantially interfere with cationic photocuring of the photocurable composition at room temperature. For example, the photopolymerizable epoxy materials can also include free-radically polymerizable functionality.

The photopolymerizable epoxy material can comprise a blend or mixture of two or more different epoxy materials. Examples of such blends include two or more molecular weight distributions of photopolymerizable epoxy materials, such as a blend of one or more low molecular weight (below 200) epoxy materials with one or more intermediate molecular weight (from 200 to 10,000) photopolymerizable epoxy materials, or one or more of such photopolymerizable epoxy materials with one or more higher molecular weight (above about 10,000) epoxy materials. Alternatively or additionally, the photopolymerizable epoxy material can comprise a blend of epoxy materials having different chemical natures, such as aliphatic and aromatic natures, or different functionalities, such as polar and non-polar properties.

One or more photocurable epoxy materials are included in the photocurable composition in a suitable amount to provide the desired efficient photocuring (or photopolymerization). For example, the one or more photopolymerizable epoxy materials can be present in an amount of at least 5 weight % and up to and including 50 weight %, or typically of at least 10 weight % and up to and including 40 weight %, based on the total weight of the photocurable composition.

Various compounds can be used as photoacid generators to generate a suitable acid to participate in the photocuring of the epoxy materials. Some of these "photoacid generators" are acidic in nature and others are nonionic in nature. Other useful photoacid generators besides those described below would be readily apparent to one skilled in the art in view of the teaching provided herein.

Onium salt acid generators useful in the practice of this invention as photoacid generators include but are not limited to, salts of diazonium, phosphonium, iodonium, or sulfonium salts including polyaryl diazonium, phosphonium, iodonium, and sulfonium salts. The iodonium or sulfonium salts include but not limited to, diaryliodonium and triarylsulfonium salts. Useful counter anions include but are not limited to complex metal halides, such as tetrafluoroborate, hexafluoroantimonate, trifluoromethanesulfonate, hexafluoro-arsenate, hexafluorophosphate, and arenesulfonate. The onium salts can also be oligomeric or polymeric compounds having multiple onium salt moieties as well as molecules having a single onium salt moiety.

Suitable iodonium salts include compounds are described in U.S. Pat. No. 5,545,676 (Palazzotto et al.) at column 2 (lines 28 through 46), as well as in U.S. Pat. No. 3,729,313 (Smith), U.S. Pat. No. 3,741,769 (Smith), U.S. Pat. No. 3,808,006 (Smith), U.S. Pat. No. 4,250,053 (Smith), and U.S. Pat. No. 4,394,403 (Smith).

Useful iodonium salts can be simple salts (for example, containing an anion such as chloride, bromide, iodide, or $C_4H_5SO_3^-$) or a metal complex salt (for example, containing $SbF_6^-$, $PF_6^-$, $BF_4^-$, tetrakis(perfluorophenyl)borate, or $SbF_5OH_{31}AsF_6^-$). Mixtures of any of these iodonium salts of the same or different class can be used if desired. Sulfonium salts are desirable for use and should be soluble in any inert organic solvents (described below) and they should also be shelf-stable, meaning they do not spontaneously promote polymerization when mixed with the other components especially an electron acceptor photosensitizer and an electron donor co-initiator prior to exposure to suitable radiation. Particularly useful sulfonium salts include but are not limited to, triaryl-substituted salts such as mixed triarylsulfonium hexafluoroantimonates (for example, commercially available as UVJ-6974 from Dow Chemical Company), mixed triarylsulfonium hexafluorophosphates (for example, commercially available as UVI-6990 from Dow Chemical Company), and arylsulfonium hexafluorophosphates (for example, commercially available from Sartomer Company).

One or more onium salts (such as an iodonium salt or a sulfonium salt) can be generally present in the photocurable composition in an amount of at least 0.05 weight % and up to and including 10 weight %, or typically at least 0.1 weight % and up to and including 10 weight %, or even at least 0.5 weight % and up to and including 5 weight %, based on the total weight of the photocurable composition.

Nonionic photoacid generators are also useful in present invention, which compounds include but are not limited to, diazomethane derivatives such as, for example, bis(benzenesulfonyl)diazomethane, bis(p-toluenesulfonyl)-diazomethane, bis(xylenesulfonyl)diazomethane, bis(cyclohexylsulfonyl)-diazomethane, bis(cyclopentylsulfonyl) diazomethane, bis(n-butylsulfonyl)diazomethane, bis(isobutylsulfonyl)diazomethane, bis(sec-butylsulfonyl)-diazomethane, bis(n-propylsulfonyl)diazomethane, bis(isopropylsulfonyl)-diazomethane, bis(tert-butylsulfonyl) diazomethane, bis(n-amylsulfonyl)-diazomethane, bis (isoamylsulfonyl)diazomethane, bis(sec-amylsulfonyl)-diazomethane, bis(tert-amylsulfonyl)diazomethane, 1-cyclohexylsulfonyl-1-(tert-butyl sulfonyl)diazomethane, 1-cyclohexylsulfonyl-1-(tert-amylsulfonyl)-diazomethane, and 1-tert-amylsulfonyl-1-(tert-butyl sulfonyl)diazomethane. Nonionic photoacid generators can also include glyoxime derivatives. Useful photoacid generators can also include bissulfone derivatives. Other classes of useful nonionic photoacid generators include disulfono derivatives.

One or more nonionic photoacid generators can be present in the photocurable composition in an amount of at least 0.05 weight % and up to and including 10 weight %, or typically at least 0.1 weight % and up to and including 10 weight %, or even at least 0.5 weight % and up to and including 5 weight %, based on the total weight of the photocurable composition.

Some photocurable compositions described herein, especially those containing photopolymerizable epoxy materials and photoacid generators, can contain one or more electron donor photosensitizers to improve photocuring efficiency. Useful electron donor photosensitizers should be soluble in the photocurable composition, free of functionalities that would substantially interfere with the cationic photocuring process, and capable of light absorption (sensitivity) within the range of wavelengths of at least 150 nm and up to and including 1000 nm.

Suitable electron donor photosensitizers initiate the chemical transformation of an onium salt (or other photoacid generator) in response to the photons absorbed from the irradiation. The electron donor photosensitizer should also be capable of reducing the photoacid generator after the electron donor photosensitizer has absorbed light (that is, photoinduced electron transfer). Thus, the electron donor photosensitizer, upon absorption of photons from irradiation, is generally capable of donating an electron to the photoacid generator.

When very rapid curing (such as the curing of thin applied films of the photocurable compositions) is desired, the electron donor photosensitizers can have an extinction coefficient of at least 1000 liter-mole$^{-1}$ cm$^{-1}$ and typically at least 50,000 liters-mole$^{-1}$ cm$^{-1}$ at the desired irradiation wavelength using the photocuring process. For example, each of the electron donor photosensitizers generally has an oxidation potential of at least 0.4 V and up to and including 3 V vs. SCE.

In general, many different classes of compounds can be used as electron donor photosensitizers for various reactants. Useful electron donor photosensitizers include but are not limited to, aromatics such as naphthalene, 1-methylnaphthalene, anthracene, 9,10-dimethoxyanthracene, benz[a]anthracene, pyrene, phenanthrene, benzo[c]phenanthrene, and fluoranthene. Other useful electron donor photosensitizers that involve the triplet excited state are carbonyl compounds such as thioxanthones and xanthones. Ketones including aromatic ketones such as fluorenone, and coumarin dyes such as ketocoumarins such as those with strong electron donating moieties (such as dialkylamino) can also be used as electron donor photosensitizers. Other suitable electron donor photosensitizers are believed to include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriarylmethanes, merocyanines, squarylium dyes, and pyridinium dyes.

It is also possible to use a mixture of electron donor photosensitizers that are chosen from the same or different classes of materials.

The one or more electron donor photosensitizers can be present in the photocurable composition in an amount of at least 0.000001 weight % and up to and including 5 weight %, and typically at least 0.0001 weight % and up to and including 2 weight %, based on the total weight of the photocurable composition.

In some embodiments, the electron donor photosensitizer is a pyrene, benzopyrene, perylene, or benzoperylene that is present in an amount of at least 0.0001 weight % and up to and including 2 weight %, based on the total weight of the photocurable composition.

In other embodiments, the electron donor photosensitizer can be replaced with a combination of one or more electron acceptor photosensitizers and one or more electron donor co-initiators.

Useful electron acceptor photosensitizers should be soluble in the photocurable composition, free of functionalities that would substantially interfere with the cationic photocuring process, and capable of light absorption (sensitivity) within the range of wavelengths of at least 150 nm and up to and including 1000 nm.

Suitable electron acceptor photosensitizers initiate the chemical transformation of an onium salt in response to the photons absorbed from the irradiation. The electron acceptor photosensitizer should also be capable of oxidizing the electron donor co-initiator (described below) to a radical cation after the electron acceptor photosensitizer has absorbed light (that is, photoinduced electron transfer). Thus, the electron acceptor photosensitizer, upon absorption of photons from irradiation, is generally capable of accepting an electron from the electron donor co-initiator.

When very rapid curing (such as the curing of thin applied films of the compositions) is desired, the electron acceptor photosensitizers can have an extinction coefficient of at least 1000 liter-mole$^{-1}$ cm$^{-1}$ and typically at least 10,000 liters-mole$^{-1}$ cm$^{-1}$ at the desired irradiation wavelength using the photocuring process.

In general, many different classes of compounds can be used as electron acceptor photosensitizers for various reactants, provided that the energetic requirements discussed above are satisfied. Useful electron acceptor photosensitizers include but are not limited to, cyanoaromatics such as 1-cyanonaphthalene, 1,4-dicyanonaphthalene, 9,10-dicyanoanthracene, 2,9,10-tricyanoanthracene, 2,6,9,10-tetracyanoanthracene; aromatic anhydrides and imides such as 1,8-naphthylene dicarboxylic, 1,4,6,8-naphthalene tetracarboxylic, 3,4-perylene dicarboxylic, and 3,4,9,10-perylene tetracarboxylic anhydride or imide; condensed pyridinium salts such as quinolinium, isoquinolinium, phenanthridinium, acridinium, and pyrylium salts. Other useful electron acceptor photosensitizers that involve the triplet excited state are carbonyl compounds such as quinones such as benzo-, naphtho-, anthro-quinones having electron withdrawing substituents (such as chloro and cyano). Ketones including aromatic ketones such as fluorenone, and coumarin dyes such as ketocoumarins such as those with strong electron withdrawing moieties (such as pyridinium) can also be used as electron acceptor photosensitizers. Other suitable electron acceptor photosensitizers are believed to include xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes and pyridinium dyes. Diarylketones and other aromatic ketones such as fluorenone are useful electron acceptor photosensitizers.

The one or more electron acceptor photosensitizers can be present in the photocurable composition in an amount of at least 0.000001 weight % and up to and including 5 weight %, and typically at least 0.0001 weight % and up to and including 2 weight %, based on the total weight of the photocurable composition.

The use of the electron acceptor photosensitizers is highly effective by the inclusion of one or more electron donor co-initiators in the photocurable composition, each of which electron donor co-initiators has an oxidation potential of at least 0.1 V and up to and including 3 V vs. SCE. Such electron donor co-initiators should be soluble in the photocurable composition.

Useful electron donor co-initiators are alkyl aromatic polyethers, arylalkylamino compounds wherein the aryl group is substituted by one or more electron withdrawing groups including but not limited to, carboxylic acid, carboxylic acid esters, ketones, aldehydes, sulfonic acid, sulfonates, and nitrile groups. For example, aryl dialkyldiamino compounds are useful in which the aryl is a substituted or unsubstituted phenyl or naphthyl group (such a phenyl or naphthyl group with one or more electron withdrawing groups as noted above), and the two alkyl groups independently comprise 1 to 6 carbon atoms.

In general, the one or more electron donor co-initiators can be present in an amount at least 0.001 weight % and up to and including 10 weight %, or more typically of at least 0.005 weight % and up to and including 5 weight %, or even at least 0.01 weight percent and up to and including 2 weight %, based on the total weight of the photocurable composition.

As noted above, all of the photocurable compositions containing various essential and optional components can further comprise dispersed carbon black in an amount of at least 0.5 weight % and up to and including 20 weight %, or at least 1 weight % and up to and including 10 weight %, based on the total weight of the photocurable composition.

Some embodiments of photocurable compositions useful in the present invention can comprise each of a photopolymerizable epoxy material as described above, a photoacid generator as described above, an electron donor photosensitizer as described above, dispersed metal particles as described below, an organic diluent such as an organic solvent medium as described below, a free-radically polymerizable material as described above, and a free radical photoinitiator as described above, wherein:

the photopolymerizable epoxy material has at least two polymerizable epoxy groups per molecule, the photoacid generator is an iodonium or sulfonium, and the metal particles are dispersed carbon-coated silver particles or dispersed carbon-coated copper particles (described below) that have a median diameter equal to or less than 0.5 μm as determined using a dynamic light scattering method.

Free Radical Photocurable Chemistries:

In other embodiments, the photocurable compositions can comprise one or more UV-curable components at least one of which is a free radically photocurable component and the photocurable composition can further comprise a free radical photoinitiator to provide free radicals during photocuring.

The one or more free-radically polymerizable compounds can be present to provide free-radically polymerizable functionality, including ethylenically unsaturated polymerizable monomers, oligomers, or polymers such as mono-functional or multi-functional acrylates (also includes methacrylates). Such free-radically polymerizable compounds comprise at least one ethylenically unsaturated polymerizable bond (moiety) and they can comprise two or more of these unsaturated moieties in many embodiments. Suitable materials of this type contain at least one ethylenically unsaturated polymerizable bond and are capable of undergoing addition (or free radical) polymerization. Such free radically polymerizable materials include mono-, di-, or poly-acrylates and methacrylates including but not limited to, methyl acrylate, methyl methacrylate, ethyl acrylate, isopropyl methacrylate, n-hexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol diacrylate, 1,3-propanediol dimethacrylate, 1, 4-butanediol diacrylate, 1,6-hexanediol diacrylate, neopentyl glycol diacrylate, neopentyl glycol dimethacrylate, trimethylolpropane triacrylate, 1,2,4-butanetriol trimethacrylate, 1,4-cyclohexanediol diacrylate, pentaerythritol triacrylate, pentaerythritol tetraacrylate, pentaerythritol tetramethacrylate, dipentaerythritol hexaacrylate, sorbitol hexaacrylate, bis[1-(2-acryloxy)]-p-ethoxyphenyldimethylmethane, bis[1-(3-acryloxy-2-hydroxy)]-p-propoxyphenyldimethylmethane, and tris-hydroxyethyl-isocyanurate trimethacrylate; the bis-acrylates and bis-methacrylates of polyethylene glycols having a molecular weight of from 200 to and including 500, co-polymerizable mixtures of acrylate monomers such as those described in U.S. Pat. No. 4,652,274 (Boettcher et al.) and acrylate oligomers such as those described in U.S. Pat. No. 4,642,126 (Zader et al.); and vinyl compounds such as styrene and styrene derivatives, diallyl phthalate, divinyl succinate, divinyl adipate, and divinyl phthalate.

Although the amount of the one or more free radically polymerizable materials is not particularly limited, they can be present in the photocurable compositions in an amount of at least 30 weight % and up to and including 90 weight % or typically of at least 40 weight % and up to and including 85 weight %, based on the total weight of the photocurable composition.

One or more free radical photoinitiators can also be present in the photocurable compositions to generate free radicals. Such free radical photoinitiators include any compound that is capable of generating free radicals upon exposure to photocuring radiation such as ultraviolet or visible radiation. For example, free radical photoinitiators can be selected from triazine compounds, thioxantone compounds, benzoin compounds, carbazole compounds, diketone compounds, sulfonium borate compounds, diazo compounds, benzophenone compounds, and biimidazole compounds, and others that would be readily apparent to one skilled in the art.

One or more free radical photoinitiators can be present in the photocurable composition in an amount of at least 0.3 weight % and up to and including 10 weight %, or typically at least 0.4 weight % and up to and including 10 weight %, or even at least 0.5 weight % and up to and including 5 weight %, based on the total weight of the photocurable composition.

In some of these embodiments, the photocurable composition comprises one or more free-radically polymerizable materials as described above, one or more free radical photoinitiators as described above, dispersed metal particles such as dispersed carbon-coated silver particles as described below, an organic solvent medium (as described below), wherein an acrylate is present as one of the free radically polymerizable components.

The photocurable compositions described herein, of either acid catalyzed chemistry or free radical chemistry generally include suitable metal particles that can act as seed metal catalytic sites for electroless plating processes. Usually only one type of metal particles are used, but it is also possible to include mixtures of metal particles, from the same or different classes of metals, that do not interfere with each other. These metal particles generally have a net neutral charge.

Useful metal particles can be chosen from one or more classes of noble metals, semi-noble metals, Group IV metals, or combinations thereof. Useful metal particles include but are not limited to, particles of gold, silver, palladium, platinum, rhodium, iridium, rhenium, mercury, ruthenium, osmium, iron, cobalt, nickel, copper, aluminum, zinc, and tungsten. Useful particles of Group IV metals include but are not limited to particles of tin, titanium, and germanium. The noble metal particles such as particles of silver, palladium, and platinum are particularly useful, and the semi-noble particles of nickel and copper are also particularly useful. Tin particles are particularly useful in the Group IV metal class. In many embodiments, silver particles or copper particles are used in the photocurable composition.

The metal particles useful in the present invention can be coated and isolated from each other using surfactants, polymers, or carbon. The carbon on carbon-coated metal particles can be amorphous, sp2 hybridized, or graphene-like in nature. Such carbon can be used to prevent aggregation of metal particles and provide improved dispersibility in the photopolymerizable composition. Useful carbon-coated metal particles include carbon-coated silver particles and carbon-coated copper particles, or mixtures of carbon-coated silver particles and carbon-coated copper particles.

The metal particles useful in the photocurable compositions can be dispersed in various organic solvents and can have improved dispersibility in the presence of the other components of the photocurable composition, such as multifunctional polymeric epoxy materials or in the presence of optional components such as multifunctional acrylate resins described below. Useful dispersants are known in the art and can also be present if desired. The methods used to disperse the metal particles include but are not limited to, ball-milling, magnetic stirring, high speed homogenization, high pressure homogenization, and ultrasonication.

The metal particles useful in these embodiments can be present in the photocurable compositions as individual particles, but in many embodiments, the metal particles are present as agglomerations of two or more metal particles. Such metal particles can be present in any geometric shape including but not limited to, spheres, rods, prisms, cubes, cones, pyramids, wires, flakes, platelets, and combinations thereof, and they can be uniform or non-uniform in shapes and sizes. The average particle size of individual and agglomerated metal particles can vary from at least 0.01 μm and up to and including 25 μm, or more likely of at least 0.02 μm and up to and including 5 μm. Although the size of the metal particles is not particularly limited, optimal benefits can be achieved using metal particles as individual particles or agglomerates, having an average particle size of at least 0.02 μm and up to and including 10 μm. The particle size distribution is desirably narrow as defined as one in which greater than 50%, or typically at least 75%, of the particles have a particle size in the range of 0.2 to 2 times the average particle size. The average particle size (same as mean particle size) can be determined from the particle size distribution that can be determined using any suitable procedure and equipment including that available from Coulter or Horiba and the appropriate mathematical calculations used with that equipment.

When carbon-coated metal particles are used, they can be designed to have a median particle diameter that is equal to or less than 0.6 μm, or less than 0.2 μm, or more likely less than 0.1 μm. Such carbon-coated metal particles generally have a minimum median diameter of 0.005 μm. Median particle diameter [Dv (50%)] can be determined using a dynamic light scattering method. For example, such a method can be carried out using a Malvern Zetasizer Nano ZS that can be obtained commercially from Malvern Instruments, Ltd.

The photocurable compositions are generally provided in a suitable organic diluent that serves as a non-aqueous (organic) solvent or combination of solvents in which the components of the photocurable composition are dissolved or dispersed. In many embodiments, the organic diluent is an organic solvent medium that includes one or more inert organic solvents such as 2-ethoxyethanol, 2-(2-methoxyethoxy)ethanol, 2-(2-ethoxyethoxy)ethanol, 1-methoxy-2-propanol (DOWANOL™ PM organic solvent), 4-heptanone, 3-heptanone, 2-heptanone, cyclopentanone, cyclohexanone, diethyl carbonate, 2-ethoxyethyl acetate, N-butyl butyrate, acetone, dichloromethane, isopropanol, ethylene glycol, and methyl lactate. Mixtures of these listed inert organic solvents can be used in the organic solvent medium in any suitable volume or weight ratio. Other useful organic solvents could be readily identified by one skilled in the art using the teaching provided herein. By "inert", it is meant that the organic solvents do not appreciably participate in any chemical reactions.

The organic diluent (such as the organic solvent medium) can provide up to and including 1 weight %, or up to at least 70 weight % or at least 10 weight % and up to and including 30 weight %, based on the total weight of the photocurable composition. The amount of inert organic solvents can be judiciously chosen depending upon the particular materials used, the means for applying the resulting photocurable composition, and desired properties including composition uniformity. The organic diluent typically includes little or no water (generally less than 5 weight % of the total photocurable composition weight) so that the photocurable compositions are considered "photocurable compositions".

When one or more photocurable components (as described above) are present as liquid organic compounds, those one or more photocurable components can act as the organic diluent and separate inert organic solvents may not be necessary. In such instances, the organic diluent can be considered a "reactive" diluent. Alternatively, one or more reactive diluents can be used combination with one or more inert organic solvents to form a suitable organic diluent.

While not essential to the photocurable compositions, an optional but desirable component is carbon black in an amount of at least 0.5 weight % and up to and including 20 weight %, or at typically at least 1 weight % and up to and including 10 weight %, based on the total weight of the photocurable composition.

Articles

The photocurable compositions described above can be formulated as described above and applied to one or both supporting sides (planar sides) of any suitable substrate (described below) using any suitable manner to form a "precursor article". For example, the photocurable composition can be applied in a uniform or pattern-wise manner to either or both supporting sides using for example dip coating, roll coating, hopper coating, spray coating, spin coating, ink jetting, photolithographic imprinting, flexographic printing using flexographic printing members (such as flexographic printing plates and flexographic printing sleeves), lithographic printing using lithographic printing plates, and gravure or intaglio printing using appropriate printing members. Flexographic printing using flexographic printing members is particularly useful to provide predetermined patterns of the photocurable composition, and this method can be used to provide multiple patterns of the same or different photocurable compositions on one or both supporting sides of the substrate, and in one or multiple portions of either supporting side of the substrate such as when it is a continuous polymeric web. More details of such processes are provided below.

The applied photocurable composition can be formed and dried into a uniform layer or a dried into a predetermined pattern. The resulting articles can be considered "precursor" articles before photocuring is carried out as described below.

As noted below in more detail, the substrates for such articles can be composed of any useful material(s) and can be individual films or sheets of any suitable sizes and shapes for example composed of a metallic material, glass, paperstock (any type of cellulosic material) or ceramic, or they can be continuous webs of materials such as continuous polymeric webs such as continuous poly(ethylene terephthalate) webs.

The various amounts of essential and optional components of the photocurable compositions are described above but are to be understood that they refer to solutions or dispersions containing such components. However, it should be understood that upon application to a suitable substrate, and optional drying, and then photocuring, the amounts of various components can be different within the applied photocurable composition. The individual amounts and relative amounts of the remaining components (if for example, inert organic solvents have been removed) can be readily calculated from the information of the amounts of components within the photocurable composition before application to a substrate.

For example, in the dried photocurable compositions, the metal particles (such as carbon-coated metal particles) can be present in an amount of at least 10 weight % and up to and including 90 weight %, particle dispersing agent(s) can be present in an amount of at least 1 weight % and up to and including 30 weight %, individual carbon particles can be present in an amount of up to and including 20 weight %, and photocurable components (described above, before curing) can be present in amounts of up to and including 90 weight %.

Once the photocurable compositions are applied onto one or both supporting sides to a transparent substrate in a suitable manner, for example in a patternwise fashion, the resulting an intermediate article that can be treated in a suitable manner to photocure the photocurable compositions in suitable patterns to provide electrically-conductive patterns having seed metal catalysts. Electrically-conductive metal patterns can then be formed in a suitable manner as described in more detail below using electroless plating processes.

A suitable dry outermost polymeric coating can be disposed over the entire surface of each electrically-conductive metal pattern but in most embodiments, it is disposed only over part of the electrically-conductive metal pattern. For example, it can be disposed over the entire electrically-conductive metal grid but only over part of the electrically-conductive metal connector, using a non-crosslinked thermoplastic polymer as described above. This arrangement of the dry outermost polymeric layer can be disposed on only one of the first supporting side and the opposing second supporting side, or on both of these supporting sides.

The dry outermost polymeric coating can have a dry thickness of less than 5 µm or more likely less than 3 µm or even less than 1 µm. The maximum dry thickness is not limited but for practical purposes, the maximum dry thickness is at most 20 µm. The dry outermost polymeric coating also has an integrated transmittance of at least 80% or more likely at least 90% as measured using techniques described above, and a glass transition temperature of at least 65° C. as described above. In some embodiments, the dry outermost polymeric coating has both a dry thickness of less than 3 µm and an integrated transmittance of greater than 90%, and the non-crosslinked thermoplastic polymer is a non-crosslinked thermoplastic non-aromatic polymer that is a non-crosslinked thermoplastic acrylic polymer.

In some particularly useful embodiments, such articles comprise electrically-conductive patterns (such as electrically-conductive metal patterns) on either or both of the first supporting side and the opposing second supporting side on a transparent substrate, which comprise electrically-conductive metal patterns, for example are composed of metal wires, which are composed of silver, copper, palladium, or platinum, and particularly copper or silver. In addition, such electrically-conductive metal patterns can be obtained by electrolessly plating carbon-coated metal particles such as carbon-coated silver particles, and optionally individual carbon particles mixed with the carbon-coated metal particles. Where the electrically-conductive metal patterns have both electrically-conductive metal grids and electrically-conductive metal connectors, the electrically-conductive metal connectors can be similarly composed except that they may comprise substantially no individual carbon particles (meaning that there are less than 5 weight % individual carbon particles).

Thus, once the intermediate articles are subjected to conditions for photocuring the photocurable compositions disposed on the supporting side(s) of a transparent substrate, and the dry outermost polymeric coatings are formed using procedures and equipment described below, the resulting product articles can be incorporated into touch screens or other devices where electrically-conductive patterns are needed.

Use of Photocurable Compositions

Before provision of the dry outermost polymeric coatings, the photocurable compositions described herein can be photocured (or photopolymerized) using suitable radiation including ultraviolet light or visible actinic light, or both. One or more suitable light sources can be used for the exposure process. Each precursor article can be exposed individually as a single element, or in alternative embodiments described below, a continuous web (for example, a roll-to-roll continuous polymeric web) comprising multiple precursor articles (comprising multiple photocurable patterns) in multiple portions on one or both supporting sides of the continuous polymeric web can be exposed individually or collectively as the continuous polymeric web is passed through exposure stations, or as an exposure device is passed in a desired path over the continuous polymeric web. The same or different photocurable compositions can be applied (for example, printed using flexography and flexographic printing members) on both supporting sides of the substrate whether the substrate is in the form of a single element or continuous polymeric web. In many embodiments, different electrically-conductive patterns can be formed on opposing supporting sides of the substrate (or continuous polymeric web) using the photocurable compositions described herein.

When a photocurable composition is uniformly applied to a suitable substrate, the resulting uniform dried layer can be "imaged" or selectively exposed (or patterned) with exposing radiation through a suitable photomask (masking element) having a desired pattern, and then appropriately removing the non-crosslinked (non-cured) photocurable composition using a suitable "developer" solution that solubilizes or otherwise removes the non-photocured material. These features or steps can be carried out on both (opposing) supporting sides of the substrate. Multiple electrically-conductive and photocured patterns can be formed in the dried layer if desired using the same or different photomasks.

More likely, predetermined patterns of one or more photocurable compositions can be formed on a suitable substrate using methods as described below.

Suitable substrates (also known as "receiver elements" in the art) useful to provide precursor articles can be composed of any suitable material as long as it does not inhibit the purpose of the photocurable composition. For example, useful substrates can be formed from materials including but are not limited to, polymeric films, metals, paperstock, rigid or flexible glasses (untreated or treated for example with tetrafluorocarbon plasma, hydrophobic fluorine, or a siloxane water-repellant material), silicon or ceramic wafers, fabrics, and combinations thereof (such as laminates of various films, or laminates of papers and films) provided that a uniform layer or pattern of a photocurable composition can be formed thereon in a suitable manner and followed by irradiation to form a uniform photocured layer or one or more photocured patterns on at least one receptive (supporting) surface thereof. The substrate can be transparent, translucent, or opaque, and rigid or flexible. Many useful substrates are transparent and have an integrated transmittance of at least 90%, and such transparent substrates can also be flexible continuous polymeric webs.

The substrate can include one or more auxiliary polymeric or non-polymeric layers or one or more patterns of other materials that are applied before a photocurable composition is applied. For example, either or both supporting (planar) surfaces of the substrate can be treated for example with a primer layer or electrical or mechanical treatments (such as graining) to render that surface a "receptive surface" to improve adhesion of the photocurable composition and resulting photocured layer or photocured pattern. An adhesive layer can be disposed on the substrate to provide various properties in response to stimuli (for example, it can be thermally activated, solvent activated, or chemically activated) and that adhesive layer can serve as a receptive layer.

In some embodiments, the substrate can comprise a separate receptive layer as a receptive surface disposed on a substrate, which receptive layer and substrate can be composed of a material such as a suitable polymeric material that is highly receptive of the photocurable composition. Such receptive layers can have a dry thickness of at least 0.05 µm and up to and including 10 µm, or typically of at least 0.05 µm and up to and including 3 µm, when measured at 25° C.

Either supporting side of the substrate (especially polymeric substrates) can be treated by exposure to corona discharge, mechanical abrasion, flame treatments, or oxygen plasmas, or by coating with various polymeric films, such as poly(vinylidene chloride) or an aromatic polysiloxane as described for example in U.S. Pat. No. 5,492,730 (Balaba et al.) and U.S. Pat. No. 5,527,562 (Balaba et al.) and U.S. Patent Application Publication 2009/0076217 (Gommans et al.).

More particularly, suitable substrate materials for forming precursor articles as continuous webs include but are not limited to, metallic films or foils, metallic films on polymer (such as metallic films on electrically-conductive polymeric films), flexible glasses, semi-conducting organic or inorganic films, organic or inorganic dielectric films, or laminates of two or more layers of such materials. For example, useful continuous web substrates can include polymeric films such as poly(ethylene terephthalate) films, poly(ethylene naphthalate) films, polyimide films, polycarbonate films, polyacrylate films, polystyrene films, polyolefin films, and polyamide films, metal foils such as aluminum foils, cellulosic papers or resin-coated or glass-coated papers, cardboard webs, and metallized polymeric films.

Particularly useful substrates are transparent polyesters films composed of poly(ethylene terephthalate) or poly(ethylene naphthalate), and films of polycarbonate, or poly(vinylidene chloride) with or without surface-treatments as noted above, all have the integrated transmittance greater than 90% as described above.

In some embodiments, a first polymer latex and second polymer latex can be mixed to form a dried primer layer on a substrate to adhere patterned materials having fine electrically-conductive lines formed using the photocurable composition. The first polymer latex can comprise a first polymer and a first surfactant such that a dried coating of the first polymer latex has a surface polarity of at least 50%. The second polymer latex can comprise a second polymer and a second surfactant such that a dried coating of the second polymer latex has a surface polarity of less than or equal to 27%.

At least one of the first and second polymers described herein comprises a vinyl polymer comprising recurring units derived at least in part from glycidyl(meth)acrylate (meaning glycidyl acrylate, glycidyl methacrylate, or both). In addition, at least one of the first polymer and second polymer is crosslinkable, which polymer can be crosslinked for example after coating the polymer mixture onto a suitable support such as during drying or various heat treatments of the substrate.

The first polymer can be a homopolymer derived from glycidyl(meth)acrylate but more likely it is a copolymer derived from glycidyl(meth)acrylate and one or more other ethylenically unsaturated polymerizable monomers.

The first polymer is particularly designed by co-polymerizing one or more glycidyl(meth)acrylates with one or more alkyl(meth)acrylates wherein the ester alkyl group has at least 2 carbon atoms including but not limited to, ethyl acrylate, ethyl methacrylate, n-butyl acrylate, n-butyl methacrylate, cyclohexyl acrylate, cyclohexyl methacrylate, lauryl acrylate, lauryl methacrylate, allyl methacrylate, hydroxyethyl methacrylate, hydroxyethyl acrylate, and others that would be readily apparent to one skilled in the art.

The second polymer latex can comprise one of more second polymers and one or more second surfactants (described below) such that a dried coating of the second polymer latex has a surface polarity of less than or equal to 28% or less than or equal to 27%. Particularly useful second polymers are vinyl polymers derived at least in part from one or more glycidyl-functional ethylenically unsaturated polymerizable monomers, such as glycidyl(meth)acrylate, for example glycidyl acrylate and glycidyl methacrylate, as described above for the first polymer. Thus, the second polymer can be a homopolymer derived from glycidyl(meth)acrylate or a copolymer derived from glycidyl(meth)acrylate and one or more other ethylenically unsaturated polymerizable monomers.

The second polymer is particularly designed by co-polymerizing one or more glycidyl(meth)acrylates with one or more co-monomers such as one or more alkyl(meth)acrylates wherein the ester alkyl group has at least 2 carbon atoms including but not limited to, ethyl acrylate, ethyl methacrylate, n-butyl acrylate, n-butyl methacrylate, cyclohexyl acrylate, cyclohexyl methacrylate, lauryl acrylate, lauryl methacrylate, allyl methacrylate, hydroxyethyl methacrylate, hydroxyethyl acrylate, and others that would be readily apparent to one skilled in the art.

The first polymer latex comprises one or more first surfactants, each of which is an alkyl sulfonate sodium salt wherein the alkyl group has at least 10 carbon atoms. For example, the first surfactant can be a sodium α-olefin ($C_{14}$-$C_{10}$) sulfonate, or the first surfactant can be a compound represented by R—$CH_2$—CH=CH—$CH_2$—S(=O)$_2$O$^-$Na$^+$ wherein R is a $C_{10}$, $C_{11}$, or $C_{12}$ hydrocarbon group, or mixtures of such compounds with different R groups that are any of $C_{10}$ to $C_{12}$ hydrocarbons groups.

The second polymer latex comprises one or more second surfactants, each of which is an alkyl phenol sulfate ammonium salt having at least 3 ethylene oxide units. For example, the second surfactant can be an ammonium salt of a sulfate polyethoxy nonylphenol, or the second surfactant can be represented by R'-phenyl-(O—$CH_2CH_2$)$_n$—S(=O)O$_2^-$NH$_4^+$ wherein R' is a $C_8$ to $C_{12}$ hydrocarbon group and n is at least 3 and up to and including 10, or more likely n is at least 3 and up to and including 6.

Useful substrates can have a desired dry thickness depending upon the eventual use of the article formed therefrom. For example, the substrate dry thickness (including all treatments and auxiliary layers) can be at least 0.001 mm and up to and including 10 mm, and especially for transparent polymeric films, the substrate dry thickness can be at least 0.008 mm and up to and including 0.2 mm.

The substrate used to prepare the articles described herein can be provided in various forms, such as for example, individual sheets of any size or shape, and continuous webs such as continuous webs of transparent polymeric substrates including transparent polyester webs that are suitable for roll-to-roll operations. Such continuous polymeric webs can be divided or formed into individual first, second, and additional portions that can be used to form the same or different photocured electrically-conductive patterns.

After patternwise application of a photocurable composition, any remaining organic solvents can be removed by evaporation such as a drying or pre-baking procedure that does not adversely affect the remaining components or prematurely cause photocuring. Useful drying conditions can be as low as room temperature for as little as 5 seconds and up to and including several hours depending upon the manufacturing process. In most processes, such as roll-to-roll processes described below, the drying conditions can be at high enough temperatures and suitable drying equipment to remove at least 90% of all inert organic solvent(s) within at least 5 seconds. For example, suitable removal of inert organic solvents can be achieved by using jets of hot air, evaporation at room temperature, or heating in an oven at an elevated temperature.

Any applied uniform layer of a photocurable composition can have a dry thickness of at least 0.1 μm and up to and including 10 μm, or typically at least 0.2 μm and up to and including 1 μm, and the optimal dry thickness can be tailored for the intended use of the resulting uniform photocured layer, which generally has about the same dry thickness as a uniform layer of the non-photocured photocurable composition.

Any applied pattern of the photocurable composition can comprise a grid of lines (or a pattern of other shapes including circles, diamonds, or ovals, or an irregular network) having an average dry width of at least 0.2 μm and up to and including 100 μm, or typically of at least 5 μm and up to and including 10 μm, and the optimal dry width can be tailored for the intended use of the resulting uniform photocured layer, which generally has photocured and electrically-conductive metal lines having essentially the same dimensions as the non-photocured electrically-conductive metal lines.

Thus, the present invention can be used to provide articles comprising a substrate and uniform layers or patterns comprised of the photocurable composition, wherein such articles can be considered "precursor" articles, meaning that they are generally the first formed articles before photocuring. Upon photocuring the photocurable compositions, the precursor article becomes an intermediate (photocured) article.

In some embodiments, the same or different photocurable composition can be applied in a suitable manner on both supporting sides (planar surfaces) of the substrate to form "duplex" or dual-sided precursor articles, and each applied photocurable composition can be in the form of the same or different uniform layer or predetermined pattern.

In many embodiments, a pattern of a photocurable composition is applied on one or both (opposing) supporting sides of the substrate (for example as a roll-to-roll continuous web) using any known printing method such as inkjet printing, gravure printing, or flexographic printing where a relief element such as elastomeric relief elements (flexographic printing members) derived from flexographic printing plate precursors, many of which are known in the art and some are commercially available, for example as the CYREL® Flexographic Photopolymer Plates from DuPont and the Flexcel SR and NX Flexographic plates and Flexcel Direct Flexographic plates from Eastman Kodak Company.

Particularly useful elastomeric relief elements are derived from flexographic printing plate precursors and flexographic printing sleeve precursors, each of which can be appropriately imaged (and processed if needed) to provide the relief elements for "printing" or applying a suitable pattern of a photocurable composition.

For example, an elastomeric relief element (for example, flexographic printing member) having a relief layer comprising an uppermost relief surface and an average relief image depth (pattern height) of at least 50 μm can be prepared from imagewise exposure of an elastomeric photopolymerizable layer in an elastomeric relief element precursor such as a flexographic printing member precursor, for example as described in U.S. Pat. No. 7,799,504 (Zwadlo et al.) and U.S. Pat. No. 8,142,987 (Ali et al.) and U.S. Patent Application Publication 2012/0237871 (Zwadlo), the disclosures of which are incorporated herein by reference for details of such flexographic printing member precursors. Such elastomeric photopolymerizable layers can be imaged through a suitable mask image.

In other embodiments, the elastomeric relief element is provided from a direct (or ablation) laser-engraveable elastomer relief element precursor, with or without integral masks, as described for example in U.S. Pat. No. 5,719,009 (Fan), U.S. Pat. No. 5,798,202 (Cushner et al.), U.S. Pat. No. 5,804,353 (Cushner et al.), U.S. Pat. No. 6,090,529 (Gelbart), U.S. Pat. No. 6,159,659 (Gelbart), U.S. Pat. No. 6,511,784 (Hiller et al.), U.S. Pat. No. 7,811,744 (Figov), U.S. Pat. No. 7,947,426 (Figov et al.), U.S. Pat. No. 8,114,572 (Landry-Coltrain et al.), U.S. Pat. No. 8,153,347 (Veres et al.), U.S. Pat. No. 8,187,793 (Regan et al.), and U.S. Patent Application Publications 2002/0136969 (Hiller et al.), 2003/0129530 (Leinenback et al.), 2003/0136285 (Telser et al.), 2003/0180636 (Kanga et al.), and 2012/0240802 (Landry-Coltrain et al.), the disclosures of all of which are incorporated herein for details of such laser-engraveable precursors.

When elastomeric relief elements are used, a photocurable composition can be applied in a suitable manner to the uppermost relief surface (raised surface) in the elastomeric relief element. Such application can be accomplished using suitable means and it is desirable that as little as possible is coated onto the sides (slopes) or recesses of the relief depressions. Anilox roller systems or other roller application systems, especially low volume Anilox rollers, below 2.5 billion cubic micrometers per square inch (6.35 billion cubic micrometers per square centimeter) and associated skive knives can be used. Optimum metering of the photocurable composition onto the uppermost relief surface can be achieved by controlling viscosity or thickness, or choosing an appropriate application means. For example, the photocurable composition can be formulated to have a viscosity for such applications of at least 1 cps (centipoise) and up to and including 5000 cps. The thickness of the photocurable composition on the relief image is generally limited to a sufficient amount that can readily be transferred to a substrate but not too much to flow over the edges of the elastomeric relief element in the recesses during application.

Thus, the photocurable composition can be fed from an Anilox or other roller inking system in a measured amount for each printed precursor article (either as a uniform layer or pattern). In one embodiment, a first roller can be used to transfer the photocurable composition from an "ink" pan or a metering system to a meter roller or Anilox roller. A photocurable composition is generally metered to a uniform thickness when it is transferred from the Anilox roller to a printing plate cylinder. When the substrate as a continuous web is moved through the roll-to-roll handling system from the printing plate cylinder to an impression cylinder, the impression cylinder applies pressure to the printing plate cylinder that transfers an image of photocurable composition from an elastomeric relief element to the substrate.

After the photocurable composition has been applied to the uppermost relief surface (or raised surface) of the elastomeric relief element, it can be useful to remove at least 25 weight % of any inert organic solvent(s) included in the photocurable composition to form a more viscous deposit on the uppermost relief surface of the relief image. This removal of inert organic solvents can be achieved in any manner, for example using jets of hot air, evaporation at room temperature, or heating in an oven at an elevated temperature, or other means known in the art.

Once on the substrate, either in a uniform layer or predetermined pattern of grid lines or other shapes (on one or both supporting sides of the substrate), the photocurable composition in the precursor article can be irradiated with suitable radiation as described above from a suitable source such as a fluorescent lamp or LED to provide a photocured layer or one or more photocured patterns on the substrate. For example, photocured can be achieved by the use of UV-visible irradiation having a wavelength ($\lambda_{max}$) of at least 190 nm and up to and including 700 nm and at intensity of at least 1,000 microwatts/cm$^2$ and up to and including 80,000 microwatts/cm$^2$. The irradiation system used to generate such radiation can consist of one or more ultraviolet lamps for example in the form of 1 to 50 discharge lamps, for example, xenon, metallic halide, metallic arc (such as a low, medium or high pressure mercury vapor discharge lamps having the desired operating pressure from a few millimeters to about 10 atmospheres). The lamps can include envelopes capable of transmitting light of a wavelength of at least 190 nm and up to and including 700 nm or typically at least 240 nm and up to and including 450 nm. The lamp envelope can consist of quartz, such as spectrocil or Pyrex. Typical lamps that can be employed for providing ultraviolet radiation are, for example, medium pressure mercury arcs, such as the GE H3T7 arc and a Hanovia 450 W arc lamp. Photocuring can be carried out using a combination of various lamps, some of or all of which can operate in an inert atmosphere. When using UV lamps, the irradiation flux impinging upon the substrate (or applied layer or pattern) can be designed to be sufficient to effect sufficient rapid photocuring of the applied photocurable composition within 1 to 20 seconds in a continuous manner, for example in a roll-to-roll operation.

An LED irradiation device to be used in for photocuring can have an emission peak wavelength of 350 nm or more. The LED device can include two or more types of elements having different emission peak wavelengths greater than or equal to 350 nm. A commercial example of an LED device that has an emission peak wavelength of 350 nm or more and has an ultraviolet light-emitting diode (UV-LED), is NCCU-033 that is available from Nichia Corporation.

The result of such irradiation of a precursor article is an intermediate article comprising the substrate (for example, individual sheets or a continuous web) and having thereon either a photocured layer or one or more photocured patterns derived from the photocurable composition on one or both supporting sides of the substrate. Each photocured pattern generally contains "seed" metallic particles that can be electrolessly plated as described below.

The resulting intermediate articles can be further processed to incorporate an electrically-conductive metal on the uniform photocured layer or photocured pattern(s), each of which includes the metal particles as "seed" materials for further application of electrically-conductive metals, for example using electroless metal plating procedures. For example, the electroless "seed" metal particles as described above can include silver, palladium, or platinum particles, or mixtures thereof, as well as carbon-coated metal particles described above, which can be electrolessly plated with silver, copper, platinum, palladium, or other metals as described below.

One useful method of this invention uses multiple flexographic printing plates (for example, prepared as described above) in a stack in a printing station wherein each stack has its own printing plate cylinder so that each flexographic printing plate is used to print onto individual substrates, or the stack of printing plates can be used to print multiple portions in a continuous transparent polymeric web (on one or both supporting sides). The same or different photocurable composition can be "printed" or applied to such a substrate (on same or opposing supporting sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate pattern is printed with the photocurable composition. Alternatively, an in-line flexographic printing process can be utilized in which the printing stations are arranged in a horizontal line and are driven by a common line shaft. The printing stations can be coupled to exposure stations, cutting stations, folders, and other post-processing equipment. A skilled worker could readily determine other useful configurations of equipment and stations using information that is available in the art. For example, an in-the-round process is described in WO 2013/063084 (Jin et al.).

Intermediate articles described herein having the described photocured electrically-conductive patterns containing metal particles can be immediately immersed in an aqueous-based electroless metal plating bath or solution, or the intermediate articles (for example as rolled up continuous webs) can be stored with just the photocured pattern(s) for use at a later time.

For example, each intermediate article can be contacted with an electroless plating metal that is the same as or different from the metal within the metal particles incorporated within the photocured pattern(s). In most embodiments, however, the electroless plating metal is a different metal from the metal used in the metal particles dispersed within the photocured pattern(s).

Any metal that will likely electrolessly "plate" on the metal particles can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals for silver, copper, platinum, or palladium seed metal catalysts. In some embodiments, the resulting electrically-conductive metal patterns are composed of silver, copper, palladium, or platinum, or a combination thereof, in either the seed metal catalysts or plated metals, or both.

The one or more electroless plating metals can be present in the aqueous-based electroless plating bath or solution in an amount of at least 0.01 weight % and up to and including 20 weight % based on total plating bath or solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that can contain formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure to provide an electrically-conductive pattern on one or more portions of one or both supporting sides of the substrate, the resulting product article can be removed from the aqueous-based electroless plating bath or solution and washed using distilled water or deionized water or another aqueous-based solution to remove any residual electroless plating chemistry. At this point, the electrolessly plated metal(s) is generally stable and can be used for their intended purpose to form various electrically-conductive articles with desired electrically-conductive metal patterns.

In some embodiments, the resulting product article can be rinsed or cleaned with water at room temperature as described for example in [0048] of US 2014/0071356 (Petcavich), or with deionized water at a temperature of less than 70° C. as described in [0027] of WO 2013/169345 (Ramakrishnan et al.).

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with another seed metal catalyst in an aqueous-based seed metal catalyst solution to facilitate deposition of additional metals.

In addition, multiple treatments with an aqueous-based electroless metal plating solution can be carried out in sequence, using the same or different conditions. Sequential washing or rinsing steps can be also carried out where appropriate at room temperature or a temperature less than 70° C.

Further, the electroless plating procedures can be carried out multiple times, in sequence, using the same or different electroless plating metal and the same or different electroless plating conditions.

Some details of useful methods and apparatus for carrying out some embodiments of the present invention are described for example in US 2014/0071356 (noted above) and WO 2013/169345 (noted above). Other details of a useful manufacturing system for preparing conductive articles especially in a roll-to-roll manner are provided in PCT/US/062366 (filed Oct. 29, 2012 by Petcavich and Jin), the disclosure of which is incorporated herein by reference.

An additional system of equipment and step features that can be used in carrying out the present invention is described in U.S. Ser. No. 14/146,867 (filed Jan. 3, 2014 by Shifley), the disclosure of which is incorporated herein by reference for any details that are pertinent to such equipment and methods.

The photocurable compositions described herein can be used in a method to provide one or more electrically conductive articles. This method comprises providing a continuous web of a transparent substrate [examples of which are described above, and can be particularly continuous webs of poly(ethylene terephthalate)].

On at least a first portion of the continuous web of a transparent substrate, the method also includes forming a photocurable pattern of a photocurable composition (as described herein) that comprises a photocurable component and dispersed metal particles as described above. The photocurable pattern is then photocured to form a photocured pattern on the first portion of the continuous web, which photocured pattern comprises dispersed metal particles (described above) as seed metal catalyst sites. Such photocured pattern can then be electrolessly plated on the first portion of the continuous web with an electrically conductive metal (as described above).

This method can further comprise:

carrying out the forming, photocuring, and electrolessly plating features described above one or more additional times on one or more additional portions of the continuous web that are different from the first portion, using the same or different photocurable composition. In such manner, multiple photocured and electrolessly plated patterns can be formed on the same or different supporting sides of the substrate. The resulting electrically-conductive patterns can be the same in composition, pattern, or electrical-conductivity, or they can be all different (as predetermined from customer needs) in any or all of these features. Such multiple electroless plate patterns can be formed as multiple electrically-conductive grids and multiple electrically-conductive connectors connected thereto, respectively, on each of the multiple portions on the one or both supporting sides of the transparent polymeric web. As noted below in more detail, a dry outermost polymeric coating can be formed on at least part but not all of each electrically-conductive pattern in any of the multiple portions. The electrically-conductive metal patterns formed in this manner on either or both the first supporting side and the opposing second supporting side of the transparent substrate, can comprise electrically-conductive metal wires comprise of silver, copper, palladium, or platinum, or two or more of such metals.

Thus, the method of this invention can be used to provide a plurality of precursor articles, comprising:

forming a first photocurable pattern on a first portion of the continuous web by applying a photocurable composition to the first portion using a flexographic printing member, advancing the continuous web comprising the first photocurable pattern to be proximate exposing radiation, and thereby forming a first photocured pattern on the first portion, forming a second photocurable pattern on a second portion of the continuous web by applying the same or different photocurable composition to the second portion using the flexographic printing member, advancing the continuous web comprising the second photocurable pattern to be proximate exposing radiation, and thereby forming a second photocured pattern on the second portion, optionally, forming one or more additional photocured patterns in a similar manner on one or more additional respective portions of the continuous web using the same or different photocurable composition and the same or different flexographic printing member, and winding up the continuous web comprising multiple photocured patterns, or using the continuous web immediately for further processing such as electrolessly plating and providing the dry outermost polymeric coatings before assembly into electronic devices.

Thus, the method can further comprise:

forming multiple electrically conductive articles from the continuous web comprising multiple photocured patterns, forming a dry outermost polymeric coating over at least part but not all of each of the multiple photocured patterns (as described herein), and assembling the individual electrically conductive articles into the same or different individual electronic devices (such as the same or different touch screen displays or devices).

Such method can also comprise:

electrolessly plating each of the multiple photocured electrically-conductive patterns in the continuous web to form multiple electrically-conductive articles, and forming the desired dry outermost polymeric coatings, and the resulting electrically-conductive articles can be assembled into the same or different individual electronic devices by the same or different user. Such electronic devices can be touch screen or other display devices that also include suitable controllers, housings, and software for any type of desired communication via the internet. Alternatively, the electronic devices can be sub-components of such touch screen or other display devices. In some embodiments, the electronic devices provided by the present invention are touch screens each of which has a viewing area of at least 1 $cm^2$ and up to and including 100 $m^2$. The size and shape of the touch screens can vary depending upon the intended use.

In some embodiments, the method of this invention can be used for preparing an electronic device comprising a touch screen, the method comprising:

assembling one or more individually electrically-conductive articles into a device housing to form a touch screen area, each of the one or more individually electrically-conductive articles comprising an electrically-conductive pattern comprising an electrically-conductive metal that has been electrolessly plated onto a photocured electrically-conductive pattern derived from a photocurable composition described herein, and a dry outermost polymeric coating is disposed over at least part but not all of the electrically-conductive metal pattern.

The dry outermost polymeric coating described herein can be prepared by first dissolving one or more suitable non-crosslinked thermoplastic polymers in an appropriate solvent (or mixture thereof), followed by printing or applying the resulting outermost polymeric coating formulation over a portion of an electrically-conductive pattern. Suitable non-crosslinked thermoplastic polymers include those described in detail above including, for example, copolymers derived from methyl methacrylate and any of n-butyl methacrylate, iso-butyl methacrylate and n-butyl methacrylate, or terpolymers derived from methyl methacrylate, 2-ethylhexyl methacrylate, and methacrylic acid, in appropriate molar ratios described above.

Appropriate solvents for the non-crosslinked thermoplastic polymer include, but are not limited to, alcohols, ethers, and glycol ethers such as dipropylene glycol methyl ether, 1-methoxy-2-propanol, and 2-methoxy-1-methylethyl acetate. Other materials may be added to the outermost polymeric coating formulation to give it desired properties, and such materials can be used for controlling viscosity or they can be surfactants for modifying surface tension.

According to the present invention, the outermost polymeric coating formulation can be deposited over at least a portion of an electrically-conductive pattern on one or both supporting sides of a substrate using various deposition or printing techniques known in the art. Such techniques include but are not limited to, flexographic printing, screen printing, gravure printing, inkjet printing, and slot die deposition. The deposition method can be used to apply the outermost polymeric coating formulation in either a one electrically-conductive pattern at a time (for example, a batch process) or over multiple electrically-conductive patterns in a continuous roll-to-roll process.

Useful product articles prepared according to the present invention can be formulated into capacitive touch screen sensors that comprise suitable patterns of electrically-conductive metal patterns and the inventive dry outermost polymeric coatings. For example, electrically-conductive metal grids and electrically-conductive metal connectors can be formed in the electrically-conductive patterns by printing a photocurable composition in predetermined patterns, followed by electrolessly plating the printed patterns with suitable metals as described above. The dry outermost polymeric coating formulation can also be applied over the electrically-conductive metal patterns only using flexographic printing as described above.

The present invention provides at least the following embodiments and combinations thereof, but other combinations of features are considered to be within the present invention as a skilled artisan would appreciate from the teaching of this disclosure:

1. A method for providing an electrically-conductive article, the method comprising:

forming an electrically-conductive pattern on first supporting side of a transparent substrate that also comprises an opposing second supporting side; and forming a dry outermost polymeric coating over at least part but not all of the electrically-conductive pattern, the dry polymeric coating having a dry thickness of less than 5 μm, an integrated transmittance of at least 80%, and comprising a non-crosslinked thermoplastic polymer having a glass transition temperature ($T_g$) that is equal to or greater than 65° C.

2. The method of embodiment 1, wherein the electrically-conductive pattern comprises at least:

an electrically-conductive grid, and an electrically-conductive connector that is connected to the electrically-conductive grid.

3. The method of embodiment 2, comprising forming the dry outermost polymeric coating over 100% or less of the electrically-conductive grid, but the dry outermost polymeric coating is disposed over less than 100% of the electrically-conductive connector.

4. The method of embodiment 2 or 3, wherein the electrically-conductive grid is an electrically-conductive metal grid and the electrically-conductive connector is an electrically-conductive metal connector connected thereto.

5. The method of any of embodiments 1 to 4 further comprising:

forming an electrically-conductive pattern on the opposing second supporting side of the transparent substrate, and forming a dry outermost polymeric coating over at least part but not all of the electrically-conductive pattern on the opposing second supporting side of the transparent substrate, this dry polymeric coating having a dry thickness of less than 5 μm, an integrated transmittance of at least 80%, and comprising a non-crosslinked thermoplastic polymer having a glass transition temperature ($T_g$) that is equal to or greater than 65° C.

6. The method of embodiment 5, wherein the electrically-conductive pattern on the opposing second supporting side comprises an electrically-conductive grid and an electrically-conductive connector that is connected to the electrically-conductive grid.

7. The method of embodiment 6, comprising forming the dry outermost polymeric coating over 100% or less of the electrically-conductive grid, but the dry outermost polymeric coating is disposed over less than 100% of the electrically-conductive connector, all on the opposing second supporting side of the transparent substrate.

8. The method of any of embodiments 1 to 7, comprising forming the outermost polymeric coating on the first supporting side using a flexographic printing member.

9. The method of any of embodiments 1 to 8, wherein the transparent substrate is a continuous transparent polymeric web.

10. The method of any of embodiments 1 to 9 comprising forming the electrically-conductive pattern on a first portion of the continuous transparent polymeric web.

11. The method of any of embodiments 1 to 10, comprising:

forming multiple electrically-conductive patterns on respective multiple portions on the first supporting side of the continuous transparent polymeric web, and forming a dry outermost polymeric coating on at least part but not all of each of the electrically-conductive patterns in the multiple portions, the dry outermost polymeric coating disposed on each of the multiple electrically-conductive patterns having a dry thickness of less than 5 μm, an integrated transmittance of at least 80%, and comprising a non-crosslinked thermoplastic polymer having a glass transition temperature ($T_g$) that is equal to or greater than 65° C.

12. The method of embodiment 11 comprising applying the dry outermost polymeric coating on each of the multiple electrically-conductive patterns in each of the multiple portions the same or different flexographic printing member.

13. The method of any of embodiments 1 to 12, wherein the non-crosslinked thermoplastic polymer is a non-crosslinked thermoplastic acrylic polymer.

14. The method of any of embodiments 1 to 13, wherein the dry outermost polymeric coating has a dry thickness of less than 3 μm.

15. The method of any of embodiments 1 to 14, wherein the non-crosslinked thermoplastic polymer is a polymer comprising at least recurring units derived from methyl (meth)acrylate and recurring units derived from an alkyl (meth)acrylate wherein the alkyl has 1 to 18 carbon atoms, wherein the recurring units derived from the alkyl(meth)acrylate comprise at least 5 mol % and up to and including 25 mol % of the total polymer recurring units.

16. The method of any of embodiments 1 to 15, wherein the electrically-conductive pattern disposed on at least the first supporting side of the transparent substrate, comprises electrically-conductive metal wires composed of at least silver, copper, palladium, or platinum.

17. The method of embodiment 5, wherein the transparent substrate is a continuous transparent polymeric web.

18. The method of embodiment 5 or 17, wherein the electrically-conductive pattern disposed on both of the first supporting side and the opposing second supporting side on the transparent substrate, comprises electrically-conductive metal wires composed of at least silver, copper, palladium, or platinum.

The following Examples are provided to illustrate the practice of this invention and are not meant to be limiting in any manner.

Representative Photocurable Composition 1:

This representative photocurable composition comprised at least the following components formed into a 100 g aliquot:

14.4 g of epoxy acrylates (CN 153 from Sartomer), 9.9 g of poly(ethylene glycol)diacrylate ($M_n$ of 258, Sigma-Aldrich), 2.1 g of poly(ethylene glycol)diacrylate ($M_n$ of 575, Sigma-Aldrich), 10.8 g of pentaerythritol tetraacrylate (Sigma-Aldrich), 0.8 g of triaryl sulfonium salt hexafluorophosphate mixed in 50% propylene carbonate (Sigma-Aldrich), 0.8 g of triaryl sulfonium salt hexafluoroantimonate mixed in 50% propylene carbonate (Sigma-Aldrich), 2.4 g of free radical photoinitiator hydroxycyclohexyl phenyl ketone (Sigma-Aldrich), 1.2 g of free radical photoinitiator methyl-4'-(methylthio)-2-morpholinopropiophenone (Sigma-Aldrich), 19.5 g of "seed" silver particles (from NovaCentrix, 20-25 nm average particle size, Ag-25-ST3), 1.1 g of carbon particles (US1074 from US Nano), 0.001 g of 9-fluorenone (Sigma-Aldrich), and 35 g of 1-methoxy isopropanol (Sigma-Aldrich) solvent.

Printing the Photocurable Composition:

Samples of printed patterns of the photocurable composition described above on various primed poly(ethylene terephthalate) PET substrates (MELLINEX® 561 available from DuPont Teijin Films) were obtained using a benchtop test printer, "IGT F1 Printability Tester" (from IGT Testing Systems Inc., Arlington Heights, Ill.) in the flexographic mode. The Anilox roller system that was used to apply the photocurable composition to flexographic printing plates had values of 1.3 BCMI and 1803 lpi, as specified by IGT. The printed patterns were formed at ambient temperature using an Anilox force of 20N, a print force of 10N, and a print speed of 0.20 m/sec.

The flexographic printing plates used for printing the photocurable composition were samples of the commercially available KODAK® Flexcel NX photopolymer plates (from Eastman Kodak Company) that had been UV radiation imaged using a mask that had a predetermined pattern written using the KODAK® SQUARE SPOT laser technology at a resolution of 12,800 dpi. The exposed flexographic photopolymer plates were processed (developed) using known conditions suggested by the manufacturer. The resulting flexographic printing plates (or members) were each 1.14 mm thick (including the PET). The backing tape used to mount each flexographic printing plate to the printing form cylinder was the 1120 Beige tape from 3M Company, which was 20 mil (0.051 cm) thick with a Shore A value of 55. The relief image design in the flexographic printing plates included a grid pattern with fine lines that had a width at the top relief surface of 7 μm. The resulting corresponding printed photocurable composition pattern had average line widths disposed on the primed PET substrates.

After being applied to the substrate, each printed pattern of photocurable composition (that is, the printed pattern) was irradiated with UV radiation using a Fusion 300 WPI medium pressure mercury lamp providing irradiation wavelengths between 190-1500 nm, with an approximate exposure of 298 mJ/cm² to photocure each printed pattern. The printed average line widths of the resulting photocured patterns in the resulting precursor articles were measured in both transmission and reflection mode using an Olympus BH-2 optical microscope.

Electroless Metal Plating:

Precursor articles comprising the photocured patterns on the various primed substrates were electrolessly copper plated by immersing the precursor articles with the cured patterns for 7 minutes at 45° C. in a beaker containing Enplate Cu-406 electroless plating solution (ENTHONE® Company), followed by rinsing with distilled water and drying with nitrogen, to form articles with electrically-conductive patterns disposed on the substrates.

Outermost Polymeric Coating Formulation:

An outermost polymeric coating formulation was prepared to have 10 weight % of ELVACITE® 4028 resin (Lucite International) in 1-methoxy-2-propanol (DOWANOL® PM organic solvent). The formulation was clear and had a viscosity of 25 cps at 22° C.

Printing the Outermost Polymer Coating Formulation:

Dry outermost polymeric coatings were provided according to the present invention by using a flexographic printing press (Performance Series P7 available from Mark Andy Inc.) in a continuous roll-to-roll operation, and a single flexographic station. This flexographic station comprised a tray that was charged with 300 grams of the outermost polymer coating formulation, an elastomeric metering roller with a hardness of approximately 30 Shore A, a ceramic Anilox roller with a steel doctor blade, and a flexographic plate roller. In this process, the outermost polymer coating formulation was delivered to the Anilox roller from the tray by the elastomeric metering roll. Excess outermost polymer coating formulation was removed from the Anilox roller by the steel doctor blade. The Anilox roller system had a value of 2.0 BCMI (billion of μm³ per in²) that is equivalent to 0.31 billion of μm³ per cm².

The outermost polymeric coating formulation was then transferred to a flexographic printing plate obtained as described below and then transferred to a moving web containing the electrolessly metal plated electrically-conductive patterns described above in a continuous web process. All printing, drying, and wind-up operations were performed at 18° C. and 50% relative humidity at a line speed of 0.10 m/sec. The final dried electrically-conductive article had a dry outermost polymeric coating disposed over at least part but not all of each electrically-conductive pattern, which dry coating was 0.3 μm in thickness.

The flexographic printing plate used for applying (printing) the outermost polymeric coating formulation had been formed from a commercially available KODAK® Flexcel NX photopolymer plate (Eastman Kodak Company) that had been imaged using a mask that had a predetermined pattern written using the KODAK® SQUARE SPOT laser technology at a resolution of 12,800 dpi. The UV-exposed flexographic photopolymer plate was processed (developed) using known conditions suggested by the manufacturer. The resulting flexographic printing plate was approximately 1 mm thick. The surface of the flexographic printing plate was left smooth (i.e. as received) except for a rectangular relief region (2×35 mm) in the area indexed to the outermost portion of the electrically-conductive patterns. This relief area did not receive (or convey) the outermost polymeric coating formulation and, consequently, left a small portion of each electrically-conductive pattern "open" (uncoated) in the resulting electrically-conductive article. This uncoated region corresponds to the region where the electrically-conductive connectors were printed.

Environmental Exposure of Samples:

All electrically-conductive articles prepared as described above were incubated in an environmental chamber maintained at 65° C. and 90% RH (relative humidity) for four weeks. The electrically-conductive articles were hung vertically in the environmental chamber and removed at various time intervals for assessment of electrical properties.

Measurement of Electrical Continuity:

The electrically-conductive pattern of this electrically-conductive article included multiple networks of electrically-conductive grids, wherein the end points of each network of electrically-conductive grids were connected to two probe-pads, one probe-pad (the near probe-pad) was connected to the BUS electrically conductive line, which in turn can be connected to the "connector" bond-pad that will be connected to an external circuit. A "connector" may be comprised of multiple connector bond-pads. The second probe-pad (the far probe-pad) is connected to the electrically-conductive grid at the furthest point of the electrical path from the "connector" bond-pad. For the present example, the connector bond-pads were not coated with the outermost polymeric coating formulation so as to provide a connector that would be available to measure electrical resistance.

The incubated electrically-conductive articles described above were tested for electrical continuity by applying a pulsed voltage (25 volts DC) to each electrically-conductive connector in each electrically-conductive pattern and measuring the electrical current between the connector bond-pad and the corresponding end probe-pad. Thus, the current pathway was from the external circuit to the connector bond-pad, through the BUS line, through the near probe-pad, through the network of electrically-conductive grids (approximately 300 mm in length), and to the end probe-pad. Electrically resistance was then determined using Ohm's Law. A resistance of greater than 1000 ohms through this pathway was considered a failure and was considered "open". For each electrically-conductive article used in these Examples, there were 34 bonding pad sites and 34 lattice row networks. Thus, the maximum number of possible "open" results per electrically-conductive article (and thus, each electrically-conductive pattern) was 34.

Measurement of Transparency:

Transparency of each electrically-conductive article was evaluated by measuring the integrated transmittance of radiation at 550 nm as described above.

Comparative Example

Three electrically-conductive articles prepared as described above were sent through the noted flexographic printing press without the application of the outermost polymeric coating formulation. The resulting Comparative electrically-conductive articles, therefore, did not comprise a dry outermost polymeric coating over the electrically-conductive patterns. Each Comparative electrically-conductive article was subsequently tested for initial electrical continuity as described above. The initial average integrated transmittance for each of the three Comparative electrically-conductive articles was 84%.

The Comparative articles were then incubated in the environmental chamber and periodically removed for evaluation of electrical continuity as described above for the Invention electrically-conductive articles. TABLE I below shows the increase in the number of "open" evaluations for the Comparative articles. As shown in TABLE I, the average number of "open" evaluations progressively increased by five per electrically-conductive article over the four-week incubation period.

Invention Example

Nine electrically-conductive articles prepared as described above were sent through the noted flexographic printing press with the printing station containing the outermost polymeric coating formulation fully engaged. Thus, each of these Invention electrically-conductive articles comprised a dry outermost polymeric coating applied over the electrically-conductive pattern including the electrically-conductive metal grids, except for a small rectangular region (2 mm×35 mm) of the electrically-conductive pattern. The dry thickness of the outermost protective coating was 0.3 µm. The initial integrated transmittance of all nine electrically-conductive articles was determined to be 84%.

The Invention articles were incubated in the environmental chamber and periodically removed for evaluation of electrical continuity as described above. TABLE I below shows the increase in the number of "open" evaluations for the Invention electrically-conductive articles. As shown in TABLE I, the average number of "open" evaluations did not increase over the four week incubation period. Thus, the dry outermost polymeric coating disposed over at least part but not all of the electrically-conductive pattern in each electrically-conductive article was determined to provide good protection of the electrically-conductive patterns against contaminates (for example, water and oxygen) even under harsh environmental conditions.

TABLE I

| Time Into Incubation (days) | Control Electrically-conductive Articles (number of "open" evaluations) | Invention Electrically-conductive Articles (number of "open" evaluations) |
| --- | --- | --- |
| 0 | 0 | 0 |
| 2 | 2 | 0 |
| 7 | 2 | 0 |
| 14 | 3 | 0 |
| 28 | 5 | 0 |

The invention has been described in detail with particular reference to certain preferred embodiments thereof, but it will be understood that variations and modifications can be effected within the spirit and scope of the invention.

The invention claimed is:

1. A method for providing an electrically-conductive article, the method comprising:
forming an electrically-conductive metal pattern on first supporting side of a transparent substrate that also comprises an opposing second supporting side, which electrically-conductive metal pattern comprises at least:
an electrically-conductive metal grid, and
an electrically-conductive metal connector that is connected to the electrically-conductive metal grid; and
forming a dry outermost polymeric coating over 100% of the electrically-conductive metal grid, but over less than 100% of the electrically-conductive metal connector, the dry polymeric coating having a dry thickness of less than 5 µm, an integrated transmittance of at least 90%, and comprising a non-crosslinked non-aromatic thermoplastic polymer having a glass transition temperature ($T_g$) that is equal to or greater than 65° C.,
wherein the non-crosslinked non-aromatic thermoplastic polymer is one or more of the following:
poly(methyl methacrylate-co-n-butyl methacrylate);
poly(methyl methacrylate-co-n-butyl methacrylate-co-methacrylic acid);
poly(methyl methacrylate-co-hexyl methacrylate);
poly(methyl methacrylate-co-octyl methacrylate);
poly(methyl methacrylate-co-lauryl methacrylate);
poly(ethyl methacrylate-co-n-butyl methacrylate-co-methacrylic acid); and
poly(ethyl methacrylate-co-methacrylic acid),
wherein the mol % of the recurring units derived from methyl methacrylate or ethyl methacrylate in the non-crosslinked non-aromatic thermoplastic polymer is from 75 mol % to 95 mol %, based on the total recurring units in the non-crosslinked thermoplastic non-aromatic polymer.

2. The method of claim 1 further comprising:
forming an electrically-conductive metal pattern on the opposing second supporting side of the transparent substrate, which electrically-conductive metal pattern comprises at least:
an electrically-conductive metal grid, and
an electrically-conductive metal connector that is connected to the electrically-conductive metal grid; and
forming a dry outermost polymeric coating over 100% of the electrically-conductive metal grid, but over less than 100% of the electrically-conductive metal connector on the opposing second supporting side of the transparent substrate, this dry polymeric coating having a dry thickness of less than 5 µm, an integrated transmittance of at least 90%, and comprising the non-crosslinked non-aromatic thermoplastic polymer.

3. The method of claim 1, comprising forming the outermost polymeric coating on the first supporting side using a flexographic printing member.

4. The method of claim 1, wherein the transparent substrate is a continuous transparent polymeric web.

5. The method of claim 1 comprising forming the electrically-conductive metal pattern on a first portion of the continuous transparent polymeric web.

6. The method of claim 1, comprising:
forming multiple electrically-conductive metal patterns on respective multiple portions on the first supporting side of the continuous transparent polymeric web, each electrically-conductive metal pattern comprising at least:
an electrically-conductive metal grid, and
an electrically-conductive metal connector that is connected to the electrically-conductive metal grid; and
forming a dry outermost polymeric coating on 100% of the electrically-conductive metal grid, but over less than 100% of the electrically-conductive metal connector of each of the electrically-conductive metal patterns in the multiple portions, the dry outermost polymeric coating disposed on each of the multiple electrically-conductive metal patterns having a dry thickness of less than 5 µm, an integrated transmittance of at least 90%, and comprising the non-crosslinked non-aromatic thermoplastic polymer.

7. The method of claim 6 comprising applying the dry outermost polymeric coating on each of the multiple electrically-conductive metal patterns in each of the multiple portions using the same or different flexographic printing member.

8. The method of claim 1, wherein the dry outermost polymeric coating has a dry thickness of less than 3 µm.

9. The method of claim 1, wherein the electrically-conductive metal pattern disposed on at least the first supporting side of the transparent substrate, comprises electrically-conductive metal wires composed of at least silver, copper, palladium, or platinum.

10. The method of claim 2, wherein the transparent substrate is a continuous transparent polymeric web.

11. The method of claim 2, wherein the electrically-conductive metal pattern disposed on both of the first supporting side and the opposing second supporting side on the transparent substrate, comprises electrically-conductive metal wires composed of at least silver, copper, palladium, or platinum.

12. The method of claim 1, wherein the electrically-conductive metal grid is in a touch region of the electrically-conductive metal pattern, and the electrically-conductive metal connector is outside the touch region of the electrically-conductive metal pattern.

13. The method of claim 1, wherein the electrically-conductive metal grid has an average dry width of at least 0.2 µm and up to and including 100 µm.

14. A method for providing an electrically-conductive article, the method comprising:
forming an electrically-conductive metal pattern on a first supporting side of a transparent substrate that also comprises an opposing second supporting side, which electrically-conductive metal pattern comprises at least:
an electrically-conductive metal grid, and
an electrically-conductive metal connector that is connected to the electrically-conductive metal grid; and
forming a dry outermost polymeric coating over 100% of the electrically-conductive metal grid, but over less than 100% of the electrically-conductive metal connector, the dry polymeric coating having a dry thickness of less than 5 µm, an integrated transmittance of at least 90%, and comprising a non-crosslinked non-aromatic thermoplastic polymer having a glass transition temperature ($T_g$) that is equal to or greater than 65° C.,
wherein the non-crosslinked non-aromatic thermoplastic polymer is one or more of the following:
poly(methyl methacrylate-co-n-butyl methacrylate);
poly(methyl methacrylate-co-n-butyl methacrylate-co-methacrylic acid);
poly(methyl methacrylate-co-hexyl methacrylate);
poly(methyl methacrylate-co-octyl methacrylate);
poly(methyl methacrylate-co-lauryl methacrylate);
poly(ethyl methacrylate-co-n-butyl methacrylate-co-methacrylic acid); and
poly(ethyl methacrylate-co-methacrylic acid),
wherein the mol % of the recurring units derived from methyl methacrylate or ethyl methacrylate in the non-crosslinked non-aromatic thermoplastic polymer is from 75 mol % to 95 mol %, based on the total recurring units in the non-crosslinked thermoplastic non-aromatic polymer.

\* \* \* \* \*